United States Patent
Park et al.

(10) Patent No.: US 10,408,900 B2
(45) Date of Patent: Sep. 10, 2019

(54) METHOD AND APPARATUS FOR PROCESSING MRI IMAGES

(71) Applicant: KOREA ADVANCED INSTITUTE OF SCIENCE AND TECHNOLOGY, Daejeon (KR)

(72) Inventors: Hyun Wook Park, Daejeon (KR); Dong Chan Kim, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 59 days.

(21) Appl. No.: 15/605,253

(22) Filed: May 25, 2017

(65) Prior Publication Data

US 2017/0343631 A1    Nov. 30, 2017

(30) Foreign Application Priority Data

May 27, 2016    (KR) .................. 10-2016-0065302

(51) Int. Cl.
| | | |
|---|---|---|
| G01R 33/385 | (2006.01) | |
| G01R 33/387 | (2006.01) | |
| G01R 33/48 | (2006.01) | |
| G01R 33/483 | (2006.01) | |

(52) U.S. Cl.
CPC ....... *G01R 33/3852* (2013.01); *G01R 33/387* (2013.01); *G01R 33/482* (2013.01); *G01R 33/4835* (2013.01)

(58) Field of Classification Search
CPC ............ G01R 33/5608; G01R 33/5611; G01R 33/4835; G01R 33/4828; G01R 33/543; G01R 33/5616
USPC ........................................................ 324/309
See application file for complete search history.

(56) References Cited

U.S. PATENT DOCUMENTS

| | | | | |
|---|---|---|---|---|
| 4,509,015 A | * | 4/1985 | Ordidge ............. | G01R 33/5615 324/307 |
| 5,459,400 A | * | 10/1995 | Moonen ............... | G01R 33/561 324/307 |
| 2007/0219442 A1 | * | 9/2007 | Aletras ............ | G01R 33/56308 600/410 |
| 2008/0258723 A1 | * | 10/2008 | Abe .................... | G01R 33/5613 324/307 |
| 2011/0031940 A1 | * | 2/2011 | Green ................ | H02M 1/4208 323/205 |
| 2011/0128000 A1 | * | 6/2011 | Harvey ............. | G01R 33/3415 324/307 |
| 2011/0260727 A1 | * | 10/2011 | Punchard ........... | G01R 33/3875 324/318 |
| 2015/0309142 A1 | * | 10/2015 | Li ...................... | G01R 33/5611 324/309 |

* cited by examiner

*Primary Examiner* — Christopher P McAndrew
(74) *Attorney, Agent, or Firm* — Sughrue Mion, PLLC

(57) ABSTRACT

The present disclosure in some embodiments provides a method and an apparatus for processing MRI images wherein a plurality of slices of an object is applied with a spatial encoding gradient and a corrected gradient for applying a radial sampling, and radially sampled magnetic resonance signals of the slices are received, and MRI images are generated with the radial sampling applied over multi-bands.

11 Claims, 23 Drawing Sheets

(a)

(b)  (c)

(a)

(b)

(c)

METHOD AND APPARATUS FOR PROCESSING MRI IMAGES

CROSS-REFERENCE TO RELATED APPLICATIONS

The present application is based on, and claims priority from, Korean Patent Application No. 10-2016-0065302, filed May 27, 2016, the disclosure of which is incorporated by reference herein in its entirety.

STATEMENT REGARDING SPONSORED RESEARCH OR DEVELOPMENT

This work was supported in part by the Korea Health Technology R&D Project through the Korea Health Industry Development Institute (KHIDI), funded by the Ministry of Health & Welfare, Republic of Korea (grant number: HI14C1135) and the Brain Research Program through the National Research Foundation of Korea (NRF) funded by the Ministry of Science, ICT & Future Planning (2014M3C7033999).

TECHNICAL FIELD

The present disclosure in some embodiments relates to a method and an apparatus for processing MRI (Magnetic Resonance Imaging) images.

BACKGROUND

The statements in this section merely provide background information related to the present disclosure and do not necessarily constitute prior art.

MRI is a technique for imaging an object by using a magnetic field. MRI is widely used for accurate diagnosis of diseases because it presents three-dimensional images of cervical or lumbar discs, joints, nerves and ligaments as well as others including bones at desired view angles.

Simultaneous multi-slice imaging is a state of the art technology under development for imaging magnetic resonance signals in less time. The multi-slice imaging is a technique of, for example, acquiring MR (magnetic resonance) signals of a plurality of slices of an object within one TR (repetition time) interval, and performing a reconstruction of images with the acquired signals separated into images corresponding to the respective positions in the object. In an MR signal acquisition, the MRI apparatus may receive MR signals in an overlapping manner after being generated from a plurality of positions in the object, and when a final MR image is reconstructed, the overlapped MR signals may cause defects and noise.

Accordingly, there is a need for providing a method and apparatus for generating an MRI image having improved image quality by suppressing defects and noise caused by overlapped MR signals in the multi-slice imaging technique.

Applying the multi-slice imaging technique to a radial sampling for generating a single magnetic resonance image of a part (object) that is moving causes a positive radial distortion or radial expansion of the image. In the radial sampling application, MRI images of a plurality of slices are formed radially spread due to the magnitude of the read-out gradient changing every TR. Therefore, it is necessary to control the gradient for generating the MRI images using the multi-slice imaging technique applied with a radial sampling.

SUMMARY

In accordance with some embodiments, the present disclosure provides an MRI (magnetic resonance imaging) apparatus including a gradient control unit, an RF (radio frequency) reception unit and an image processing unit. The gradient control unit is configured to apply a spatial encoding gradient to at least two slices of a plurality of slices and to apply a corrected gradient for the application of a radial sampling to the at least two slices. The RF reception unit is configured to receive a magnetic resonance signal of each of the at least two slices radially sampled as the corrected gradient is applied. The image processing unit is configured to generate an MRI image of each of the at least two slices based on the received magnetic resonance signals.

In accordance with another embodiment, the present disclosure provides an MRI (magnetic resonance imaging) method including performing a gradient control by applying a spatial encoding gradient to at least two slices of a plurality of slices and applying a corrected gradient for the application of a radial sampling to the at least two slices, and performing an RF (radio frequency) reception by receiving a magnetic resonance signal of each of the at least two slices radially sampled as the corrected gradient is applied, and performing an image processing by generating an MRI image of each of the at least two slices based on the received magnetic resonance signals.

Figure 1:
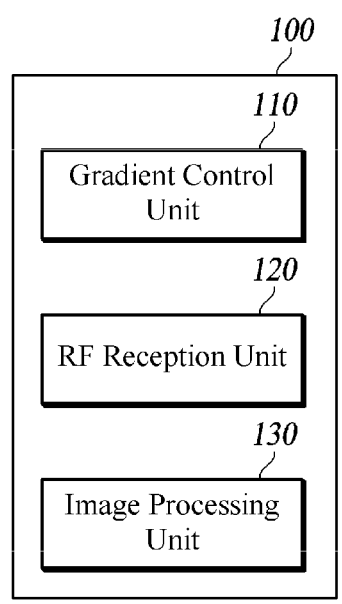
FIG. 1 is a schematic diagram of a configuration of a magnetic resonance imaging apparatus 100 according to at least one embodiment of the present disclosure.

| REFERENCE NUMERALS | |
|---|---|
| 100: MRI apparatus | 110: Gradient control unit |
| 120: RF reception unit | 130: Image processing unit |

DETAILED DESCRIPTION

The present disclosure in some embodiments provides a method and an apparatus for processing MRI images wherein a plurality of slices of an object is applied with a spatial encoding gradient and a corrected gradient for applying a radial sampling, and radially sampled magnetic resonance signals of the slices are received, and MRI images are generated with the radial sampling applied over multi-bands.

Exemplary embodiments of the present disclosure are described below with reference to the accompanying drawings.

The terms used in this specification will be briefly described, and then embodiments of the present disclosure will be described in detail.

Although the terms used in this specification are selected, as much as possible, from general terms that are widely used at present while taking into consideration the functions obtained in accordance with at least one embodiment, these terms may be replaced by other terms based on the intentions of those skilled in the art, judicial precedent, emergence of new technologies, or the like. Additionally, in a particular case, terms that are arbitrarily selected by the applicant may be used. In that case, the meanings of the terms will be disclosed in detail in the corresponding description of the present disclosure. Accordingly, the terms used herein should be defined based on practical meanings thereof and the whole content of this specification, rather than their literal names.

Throughout this specification, when a part "includes" or "comprises" a component, the part is meant to further include other components, not excluding thereof unless there is a particular description contrary thereto. The terms such as "unit", "module", and the like refer to units for processing at least one function or operation, which may be implemented by hardware, software, or a combination thereof.

As used herein, the term "image" refers to multi-dimensional data consisting of discrete image elements (e.g., pixels in a two-dimensional image and voxels in a three-dimensional image). For example, the images may include medical images of an object acquired by X-ray, CT, MRI, ultrasound, and other medical imaging systems.

Additionally, in this specification, the "object" may include a person, an animal, or a part of a person or an animal. For example, the object may include an organ such as the liver, heart, uterus, brain, breast, or abdomen, or a blood vessel. The "object" may also include a phantom. A phantom refers to a material that has a volume and is very close to the density and effective atomic number of a living thing, and may include a spherical phantom having properties similar to those of a human body.

In this specification, "MRI" or "Magnetic Resonance Imaging" refers to an object image acquired by using the principle of nuclear magnetic resonance.

In this specification, the term "pulse sequence" refers to a sequence of signals repeatedly applied in an MRI apparatus. The pulse sequence may include time parameters of an RF pulse, for example, a TR (repetition time) and a TE (time to echo).

In this specification, the "pulse sequence diagram" describes an order of events occurring in the MRI apparatus. For example, the pulse sequence diagram may be a diagram showing an RF pulse, a gradient, a magnetic resonance signal, and the like over time.

In this specification, "TR" may mean the repetition time of an RF pulse. For example, it may mean the time between a point in time at which a first RF pulse is transmitted and a point in time at which a second RF pulse is transmitted.

In the present specification, the term "spatial encoding" refers to acquiring position information along a gradient axis (direction) by applying a linear gradient causing dephasing of proton spin in addition to dephasing of the proton spin by an RF signal.

The MRI apparatus is an apparatus for acquiring an image of a single-layer region of an object by a contrast representation of the intensity of a magnetic resonance (MR) signal with respect to a radio frequency (RF) signal generated in a magnetic field of a specific magnitude. For example, when an object is placed in a strong magnetic field and an RF signal that resonates only a specific nucleus (e.g., a hydrogen nucleus) is instantaneously emitted onto the object and interrupted, a magnetic resonance signal is emitted from the specific nucleus. Then, the MRI apparatus can acquire an MR image by receiving this magnetic resonance signal. The magnetic resonance signal refers to an RF signal emitted from an object. The intensity of the magnetic resonance signal may be determined by the concentration of predetermined atoms (e.g., hydrogen atoms) included in the object, the relaxation time T1, the relaxation time T2, and the flow of blood or other fluids.

The MRI apparatus includes features different from those of other imaging apparatuses. Unlike other imaging apparatuses, such as CT, wherein acquisition of images is dependent on the direction of the detecting hardware, an MRI apparatus can acquire two-dimensional images or three-dimensional volumetric images of an arbitrary point to which the MRI apparatus is directed. Further, unlike CT, X-ray, PET, and SPECT apparatuses, an MRI apparatus can acquire an image having a high soft tissue contrast without exposing the object and the examiner to radiation. Thus, the MRI apparatus can acquire a neurological image, an intravascular image, a musculoskeletal image, and an oncologic image, in which clear depiction of abnormal tissues is important.

Hereinafter, at least one embodiment of the present disclosure will be described in detail with reference to the accompanying drawings so that those skilled in the art can easily practice the present disclosure. The present disclosure may, however, be embodied in many different forms and should not be construed as limited to the embodiments set forth herein. Further, in the drawings, irrelevant portions to some embodiments are omitted for clarity. In the following description, like reference numerals designate like elements, although the elements are shown in different drawings.

FIG. 1 is a schematic diagram of a configuration of a magnetic resonance imaging apparatus 100 according to at least one embodiment of the present disclosure.

Referring to FIG. 1, the magnetic resonance imaging apparatus 100 may include at least one of a gradient control unit 110, an RF reception unit 120 and an image processing unit 130. Here, the magnetic resonance imaging apparatus 100 may generate a magnetic resonance image using a Cartesian sampling or a radial sampling scheme.

The gradient control unit 110 according to some embodiments may control a gradient coil to generate a spatial encoding gradient. The gradient coil may include X, Y and Z coils that generate gradients along the X-axis, Y-axis and Z-axis, which are orthogonal to each other. The spatial encoding gradient may include gradients along the X-axis, Y-axis, and Z-axis.

By applying the spatial encoding gradient to the object, the position information about each part may be provided through induction of different resonance frequencies of the respective parts of the object. Accordingly, as the spatial encoding gradient is applied to the object, the magnetic resonance signal of the object received through the RF receiver 120 may include position information that can be expressed in a three-dimensional coordinate system. The gradients along the X-axis, Y-axis, and Z-axis may correspond to a frequency gradient, a phase gradient and a slice gradient, respectively.

In addition, the gradient control unit 110 may control the gradient coils to further generate a gradient in the first direction. Here, the first direction may be a direction in which one of the spatial encoding gradients is applied. For example, the first direction may be the slice direction (e.g., the Z-axis direction). In this case, the gradient control unit 110 may additionally apply the slice gradient while the frequency gradient among the spatial encoding gradients is applied to the object. For example, the slice gradient further applied to the object may have the same signal strength and application timing as the frequency gradient among the spatial encoding gradients.

The gradient control unit 110 may change the position information included in the magnetic resonance signal of the object by additionally applying the slice gradient to the object. For example, the magnetic resonance signal of the object may include a position information shifted along the frequency direction or frequency axis (e.g., the X-axis). In addition, the degree to which the position information is shifted may depend on the position on the object at which the magnetic resonance signal is received. Hereinafter, the gradient in the first direction that is additionally applied to the object is referred to as an "additional gradient."

The gradient control unit 110 according to at least one embodiment may generate a pulse sequence information to apply a spatial encoding gradient and an additional gradient to a plurality of slices. Here, the slice may be a unit area in object for acquiring a magnetic resonance signal to generate one MRI image. In addition, application of a gradient to a plurality of slices may mean applying a gradient to a plurality of slices at discontinuous positions or continuous positions on the object during one TR. The pulse sequence information generated by the gradient control unit 110 may include information on the intensity, application time, application timing, and the like of a pulse signal applied to the gradient coil. Alternatively, the gradient control unit 110 may receive a pulse sequence information from an external module.

When the magnetic resonance imaging apparatus 100 generates an MRI image by using the radial sampling scheme, the magnitude of the gradient of the read-out section changes every TR.

Therefore, when the radial sampling is applied, the gradient control unit 110 may correct the additional gradient (gradient in a first direction) applied to the object, based on change in magnitude of a read-out gradient. Hereinafter, the corrected additional gradient will be referred to as a corrected gradient.

That is, the gradient control unit 110 may additionally apply, to the object, a corrected gradient which is based on change in magnitude of the read-out gradient so as to implement the radial sampling. The gradient control unit 110 may calculate the magnitude of the corrected gradient based on Equation 1.

Equation 1

$$G_z = A \cos(\theta + \phi)$$ Equation 1 wherein $G_z$ denotes the magnitude of the corrected gradient applied along the Z axis, A denotes the magnitude of the additional gradient in Cartesian coordinates, $\theta$ denotes the angle of each slice in radial sampling, and $\phi$ denotes the offset value of radial sampling.

Figure 11:
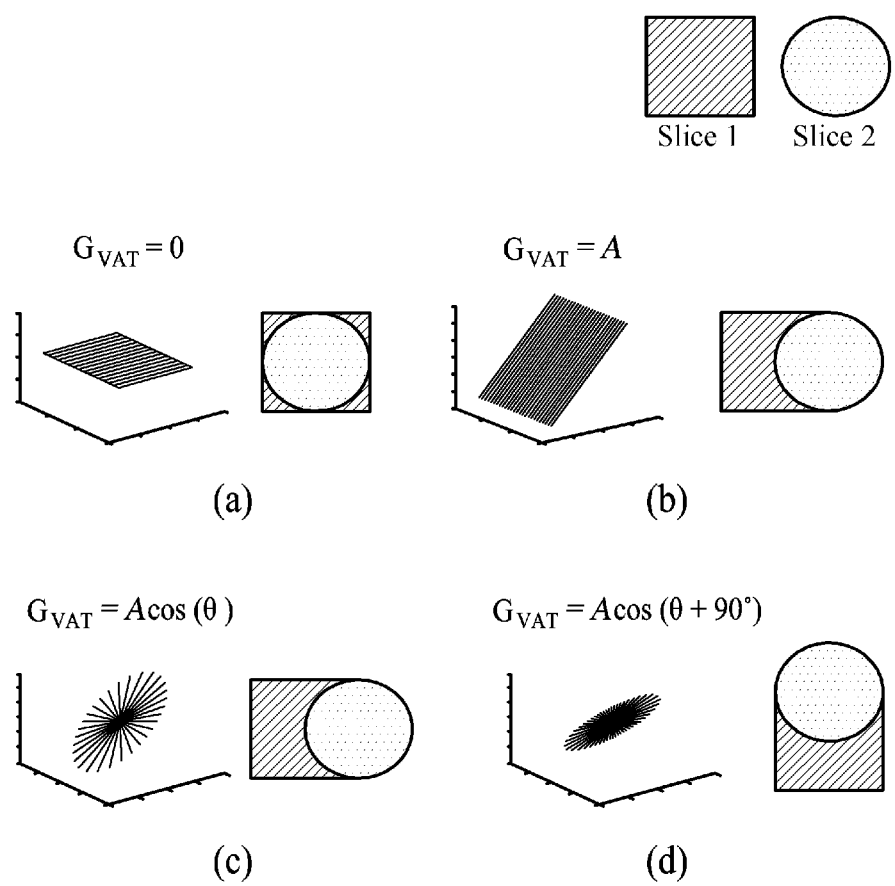
FIG. 11 is an exemplary diagram of the magnetic resonance imaging apparatus 100 producing magnetic resonance images by applying a Cartesian sampling or radial sampling, according to at least one embodiment.

$\phi$ is a variable for determining a direction in which each of slices is shifted. For example, when $\phi$ is set to 0° in the gradient control unit 110, each of the plurality of slices is moved toward the X axis. When $\phi$ is set to 90°, each of the plurality of slices is moved toward the Y axis. The change in the slices (change in the gradient) in accordance with the corrected gradient in the gradient control unit 110 is shown in FIG. 11. In equation 1, the gradient control unit 110 use a cosine function for calculating $G_z$, but the present invention is limited thereto. The gradient control unit 110 may use a sine function for calculating $G_z$.

The RF reception unit 120 may include at least one coil, and receive an MR signal at each coil. For example, a plurality of coils may include RF coils with various channels such as 16, 32, 72 and 144 channels.

According to some embodiments, the RF receiver 120 may receive a magnetic resonance signal emitted by a plurality of slices during one TR. The RF reception unit 120 may receive the magnetic resonance signals of the respective slices included in the plurality of slices in a superposed manner. For example, the RF reception unit 120 may have an RF control unit (not shown) apply an RF pulse signal including a plurality of frequency components to an object, and thereby simultaneously receive magnetic resonance signals emitted by a plurality of slices. Meanwhile, the simultaneous reception by the RF reception unit 120 of the magnetic resonance signals may mean that the RF reception unit 120 acquires magnetic resonance signals of a plurality of slices in one read-out section.

Further, each slice may include position information shifted by a different amount along the frequency axis (for example, the X-axis).

Additionally, the RF reception unit 120 may receive a magnetic resonance signal undersampled in a second direction different from the first direction. For example, when the first direction is the slice direction (e.g., the Z-axis direction), the second direction may be the phase direction (e.g., the Y-axis direction). The RF reception unit 120 may receive a magnetic resonance signal undersampled in the phase direction based on the phase gradient controlled by the gradient control unit 110.

Alternatively, the RF receiver 120 may have the RF control unit (not shown) receive magnetic resonance signals from an object having been applied with a spiral pulse sequence having a spiral trajectory in k-space. In this case, the RF reception unit 120 may receive a magnetic resonance signal undersampled in a spiral direction as a spiral pulse sequence is applied to the object.

According to some embodiments, the RF reception unit 120 may provide the received magnetic resonance signal to the image processing unit 130. Therefore, the magnetic resonance signal provided to the image processing unit 130 may be the magnetic resonance signals of the respective slices in the plurality of slices, which have been superposed and undersampled in the second direction.

Additionally, the RF reception unit 120 may receive a radially sampled magnetic resonance signal based on the corrected gradient controlled by the gradient control unit 110. Here, while the RF reception unit 120 is described as receiving only radially sampled magnetic resonance signals, embodiments of the present disclosure are not limited thereto. The RF reception unit 120 may receive a magnetic resonance signal that has undergone an undersampling process and a radial sampling process sequentially.

The image processing unit 130 may process magnetic resonance signals received from the RF reception unit 120 to generate a magnetic resonance image. The image processing unit 130 may apply various kinds of signal processing such as amplification, frequency conversion, phase detection, low frequency amplification and filtering to the magnetic resonance signals received from the RF reception unit 120.

For example, the image processing unit 130 may arrange digital data in k-space (also referred to as, for example, Fourier space or frequency space) of a memory, and generate an image from the data through two- or three-dimensional Fourier transform. The k-space may be a set of raw data for a magnetic resonance signal. The k-space may include position information and contrast information of the magnetic resonance signal.

According to some embodiments, the image processing unit 130 may generate, based on magnetic resonance signals of a plurality of slices, a magnetic resonance signal of each slice included in the plurality of slices.

Additionally, the image processing unit 130 may receive results of undersampling of the magnetic resonance signals of the plurality of slices in the second direction. Depending on the results of undersampling in the second direction, some of the k-space columns (e.g., column Ky of the k-space) may be empty, that is, containing no data. The image processor 130 may interpolate a non-measured signal using a parallel imaging technique. The parallel imaging technique may include, for example, a SENSE (sensitivity encoding) technique and a GRAPPA (generalized autocalibrating partially parallel acquisitions) technique.

For example, the image processor 130 may calculate a spatial correlation (convolution kernel) coefficient which is a spatial interaction value between a calibration signal and a neighboring measured source signal, through self-calibration by using the GRAPPA technique, and estimate the non-measured signal by using the calculated spatial correlation coefficient. Specifically, the GRAPPA technique may recover the k-space lines for respective channels that are not obtained using the received magnetic resonance signal and the additional auto-calibration signal line (ACS line).

Further, the image processing unit 130 may acquire a k-space with the magnetic resonance signals of the respective slices in the plurality of slices superposed. The magnetic resonance signal of each of the slices may include position information shifted by a different amount along the frequency axis (e.g., the X-axis).

The image processing unit 130 may separate the magnetic resonance signal of each slice from the magnetic resonance signals of the plurality of slices. The image processing unit 340 may separate the magnetic resonance signals of the respective slices and generate a magnetic resonance image of each slice, using a simultaneous multi-slice imaging. The multi-slice image reconstruction may include techniques such as slice-GRAPPA and MS-CAIPIRINHA (multi-slice controlled aliasing in parallel imaging results in higher acceleration).

For example, the image processor 130 may use the presence of a difference in coil sensitivity information between the multiple slices according to the multi-slice image reconstruction technique of choice in order to separate the magnetic resonance signal of each slice from the magnetic resonance signals of the plurality of slices received in a superposed manner.

Generally, when the magnetic resonance signals of a plurality of slices are separated according to a multi-slice image reconstruction technique, defects and noise may be generated. This may be due to a small difference in coil sensitivity information between slices because the superposed magnetic resonance signals of the respective slices include similar position information (for example, information being similar between the frequency direction (X-axis) and the phase direction (Y-axis) except for the slice direction (Z-axis)).

According to some embodiments, the magnetic resonance imaging apparatus 100 may shift the position information corresponding to each slice in the plurality of slices by different amounts along the frequency axis (for example, the X-axis), thereby increasing the difference in coil sensitivity information between slices. Accordingly, the image processing unit 130 may generate a magnetic resonance image with defects and noise reduced.

As described above, the magnetic resonance imaging apparatus 100 performs the parallel imaging process based on the result of undersampling in the second direction different from the first direction, and therefore can shorten the scan time. In addition, the undersampled magnetic resonance signal appears aliased in the phase direction, different from the frequency direction, which provides an undiminished difference in coil sensitivity information between slices.

As described above, the magnetic resonance imaging apparatus 100 can provide the user with MRI images with an enhanced signal-to-noise ratio (SNR) while shortening the scan time.

Meanwhile, thanks to the corrected gradient, the magnetic resonance imaging apparatus 100 can overcome the conventional inability to apply the radial sampling to the multi-slice imaging technique. In addition, the MRI apparatus 100 may apply the radial sampling to each slice in a plurality of slices by using a corrected gradient, thereby providing an MRI image having a wider field of view (FOV) area (for example, rectangular area) than in the typical radial sampling.

Figure 2:
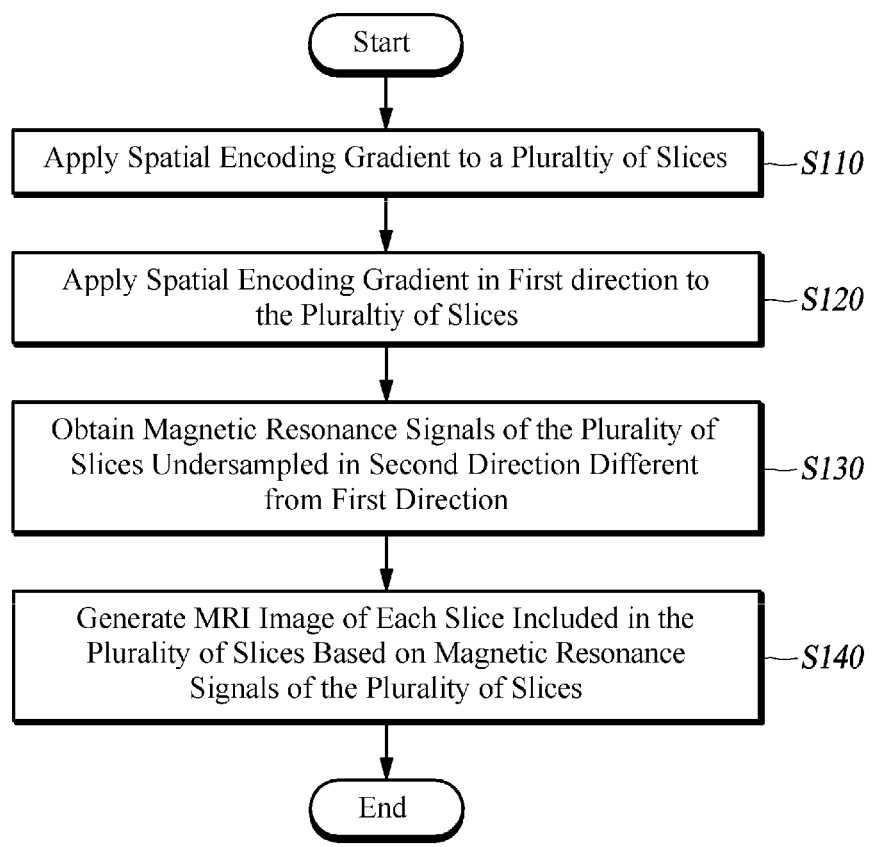
FIG. 2 is a flowchart of a magnetic resonance imaging method according to at least one embodiment of the present disclosure.

FIG. 2 is a flowchart of a magnetic resonance imaging method according to at least one embodiment of the present disclosure.

Referring to FIG. 2, a magnetic resonance imaging apparatus 100 according to some embodiments may apply a spatial encoding gradient to a plurality of slices (S110). Here, a slice may be a unit area of the object for acquiring a magnetic resonance signal to generate one magnetic resonance image. In addition, applying a gradient to a plurality of slices may mean applying a gradient to a plurality of slices at discontinuous positions or continuous positions on the object during one TR.

As the spatial encoding gradient is applied to the object, the position information on each part of the object may be provided by inducing different resonance frequencies for the respective parts of the object. Accordingly, the magnetic resonance signal of the object may include position information that may be expressed in a three-dimensional coordinate system. The plurality of slices may be selected from the same tissue or similar tissues in the object. In this case, when a spatial encoding gradient is applied to the plurality of slices, the respective slices may emit spatial encoding gradients having the same or similar position information (for example, information being similar between the frequency direction (X-axis) and the phase direction (Y-axis) except for the slice direction (Z-axis)).

The spatial encoding gradient may include a slice gradient, a frequency gradient, and a phase gradient.

According to some embodiments, the magnetic resonance imaging apparatus 100 may additionally apply a gradient in a first direction to a plurality of slices (S120). Here, the first direction may be a direction in which one of the spatial encoding gradients is applied. For example, the first direction may be the slice direction (e.g., the Z-axis). In this case, the magnetic resonance imaging apparatus 100 may additionally apply a slice gradient while a frequency gradient is applied to the plurality of slices among the spatial encoding gradients. For example, the gradient in the slice direction or slice gradient additionally applied to the object may have the same application timing as the gradient in the frequency direction or frequency gradient among the spatial encoding gradients. Hereinafter, the gradient in the first direction is referred to as an "additional gradient."

According to some embodiments, the magnetic resonance imaging apparatus 100 may change the position information included in the magnetic resonance signals emitted by each slice included in a plurality of slices when the additional gradient is applied to the plurality of slices. For example, the magnetic resonance signal of each slice may include position information shifted along the frequency axis (e.g., the X-axis). In addition, the degree to which the position information is shifted may depend on the position of each slice in the object. Therefore, when the spatial encoding gradients and the additional gradient are applied to a plurality of slices, each slice may emit a magnetic resonance signal including position information shifted by a different amount along the frequency axis (e.g., the X axis). Even when a plurality of slices is selected from the same tissue, the position information included in the magnetic resonance signal of each slice may be varied as the additional gradient is applied.

The magnetic resonance imaging apparatus 100 may receive magnetic resonance signals of a plurality of slices undersampled in a second direction different from the first direction (S130). For example, when the first direction is the slice direction, the second direction may be the phase direction. In this case, the magnetic resonance imaging apparatus 100 may receive magnetic resonance signals undersampled in the phase direction.

Alternatively, the magnetic resonance imaging apparatus 100 may receive magnetic resonance signals from an object to which a spiral pulse sequence having a spiral trajectory in k-space is applied. In this case, the magnetic resonance imaging apparatus 100 may receive a magnetic resonance signal undersampled in a spiral direction as a spiral pulse sequence is applied to the object.

Further, the magnetic resonance imaging apparatus 100 may receive magnetic resonance signals superposed after they are emitted by a plurality of slices. For example, the magnetic resonance imaging apparatus 100 may apply an RF signal to a plurality of slices simultaneously to thereby receive magnetic resonance signals emitted by a plurality of slices at the same time. The magnetic resonance imaging apparatus 100 simultaneously receiving magnetic resonance signals may mean that the magnetic resonance imaging apparatus 100 acquires magnetic resonance signals of a plurality of slices in one read-out section.

Further, the magnetic resonance imaging apparatus 100 may generate a magnetic resonance image of each slice in the plurality of slices based on the magnetic resonance signals of the plurality of slices (S140).

The magnetic resonance imaging apparatus 100 may receive results of undersampling of the magnetic resonance signals of a plurality of slices in the second direction. Depending on the results of undersampling in the second direction, some of the k-space columns (e.g., column Ky of the k-space) may be empty, containing no data. The MRI apparatus 100 may interpolate a non-measured signal using a parallel imaging technique. The parallel image processing technique may include, for example, a sense (sensitivity encoding) technique and a GRAPPA technique.

Further, the magnetic resonance imaging apparatus 100 may acquire a k-space with the magnetic resonance signals of the slices in the plurality of slices superposed. The magnetic resonance signal of each of the slices may include position information shifted by a different amount along the frequency axis (e.g., the X-axis).

The magnetic resonance imaging apparatus 100 may separate the magnetic resonance signal of each slice from the magnetic resonance signals of the plurality of slices. The magnetic resonance imaging apparatus 100 may separate the magnetic resonance signals of the respective slices and generate a magnetic resonance image of each slice, using multi-slice imaging. The multi-slice image reconstruction technique may include, for example, slice-GRAPPA and MS-CAIPIRINHA.

The magnetic resonance imaging apparatus 100 may use a difference in coil sensitivity information between a plurality of slices according to a determined multi-slice image reconstruction to separate the magnetic resonance signal of each slice from the magnetic resonance signals of the plurality of slices received in a superposed manner.

As described above, the magnetic resonance imaging apparatus 100 according to some embodiments may include different position information even for magnetic resonance signals emitted from a plurality of slices selected from the same tissue, and thus generate a magnetic resonance image of each slice with an enhanced signal-to-noise ratio (SNR).

Figure 3:
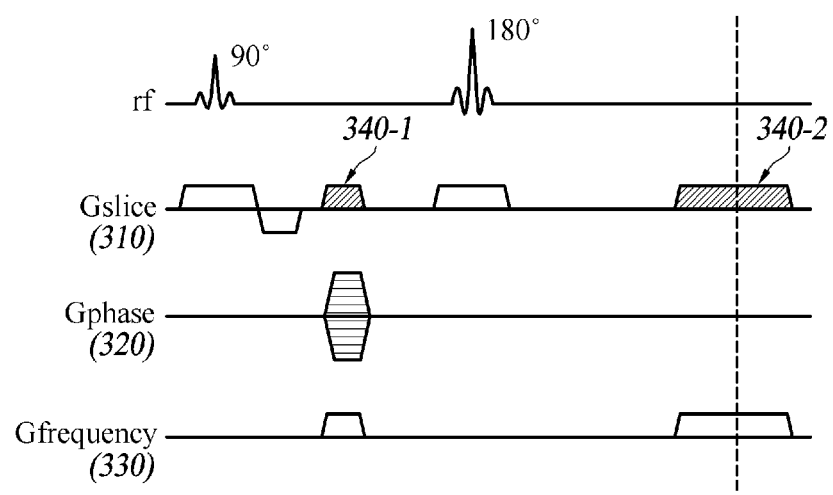
FIG. 3 is an exemplary spin echo sequence diagram including additional gradients, according to at least one embodiment.

FIG. 3 is an exemplary spin echo sequence diagram including a gradient, according to at least one embodiment.

Referring to FIG. 3, the magnetic resonance imaging apparatus 100 applies spatial encoding gradients and an additional gradient based on a spin echo technique. Here, the spin echo technique may be a technique of imaging a signal generated by applying a 90-degree RF pulse to an object and then applying a 180-degree RF pulse which is a refocusing pulse. The spatial encoding gradient may include a slice gradient (Gslice) 310, a phase gradient (Gphase) 320 and a frequency gradient (Gfrequency) 330.

The magnetic resonance imaging apparatus 100 according to some embodiments may apply an RF signal to an object and apply additional gradients 340-1 and 340-2 while the frequency gradient 330 is applied to the object.

The magnetic resonance imaging apparatus 100 may receive magnetic resonance signals from a plurality of slices for each TR as it applies an RF pulse signal including a plurality of frequency components to the object.

Figure 4:
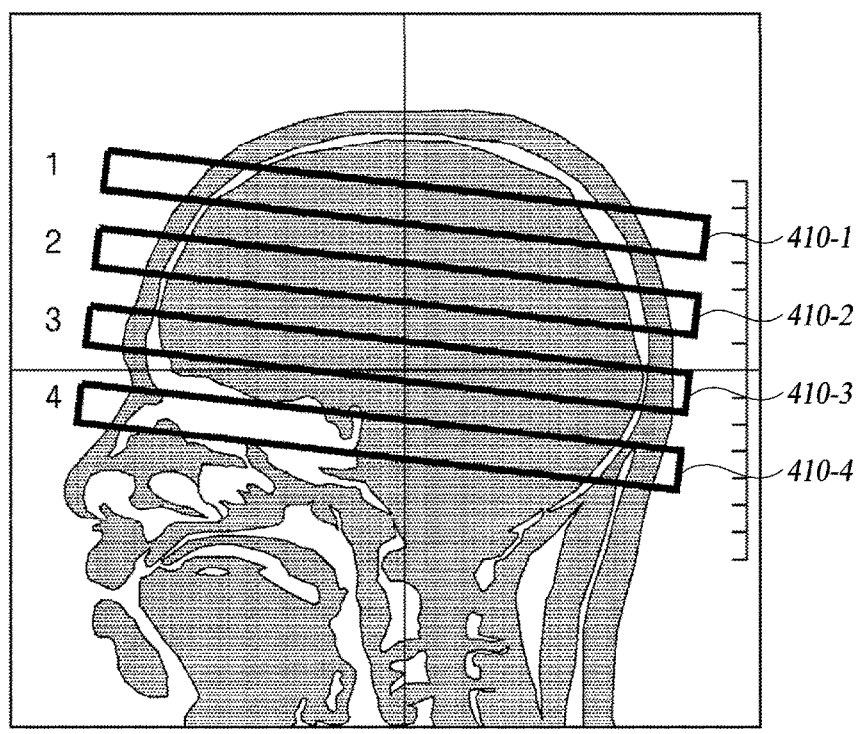
FIG. 4 is an exemplary diagram of the magnetic resonance imaging apparatus 100 selecting a plurality of the brain tissue slices from a subject, according to at least one embodiment.

FIG. 4 is an exemplary diagram of the magnetic resonance imaging apparatus 100 selecting a plurality of slices from the brain tissue of an object. As shown in FIG. 4, the magnetic resonance imaging apparatus 100 may select first to fourth slices 410-1 to 410-4 from the brain tissue of the object.

Figure 5A:
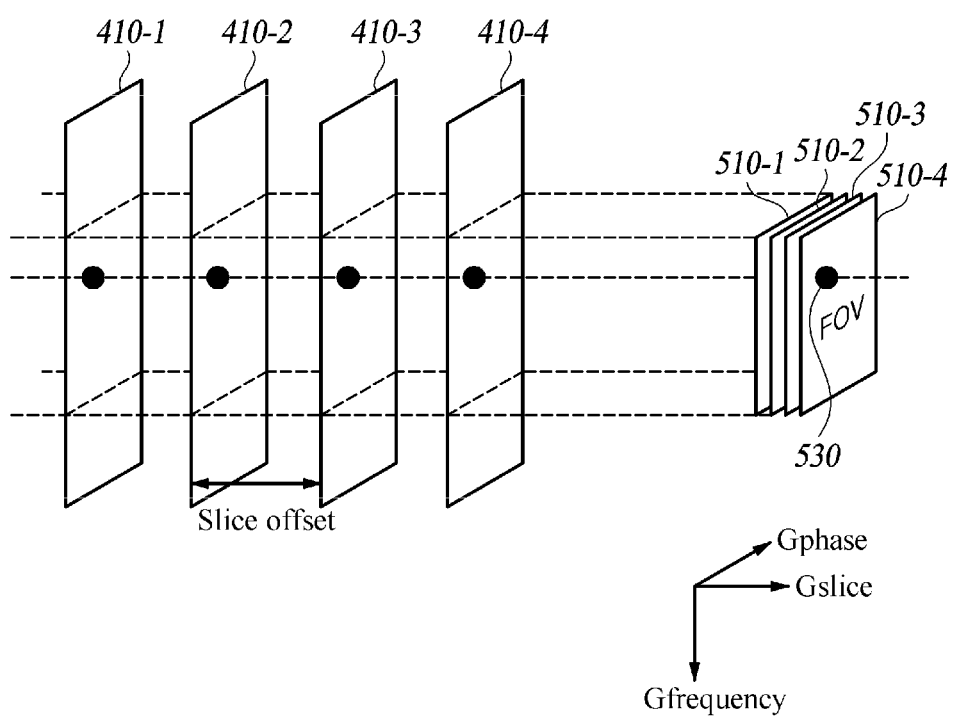
FIG. 5A is an exemplary diagram of magnetic resonance signals received from a plurality of slices 410-1 to 410-4 according to at least one embodiment.
Figure 5B:
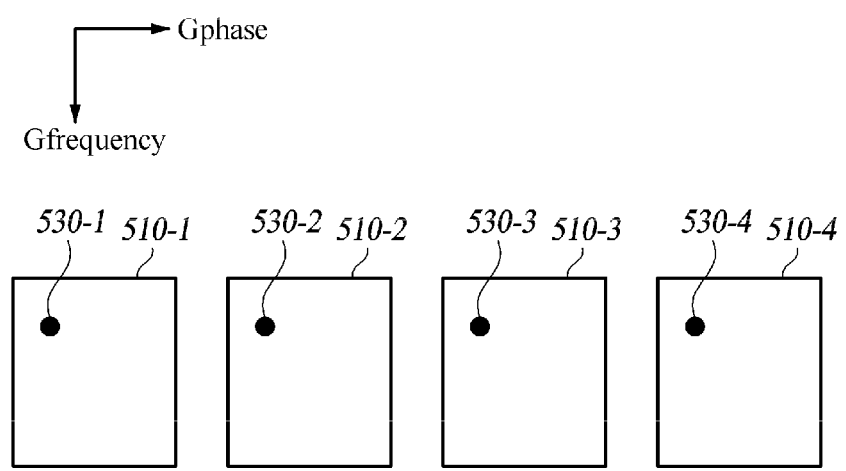
FIG. 5B is a diagram of the magnetic resonance signals received from the respective slices included in the plurality of slices 410-1 to 410-4.

FIG. 5A is an exemplary diagram of magnetic resonance signals received from a plurality of slices 410-1 to 410-4, and FIG. 5B is a diagram of a magnetic resonance signal received from each slice in the plurality of slices 410-1 to 410-4.

Referring to FIG. 5A, the magnetic resonance imaging apparatus 100 may determine fields of view (FOVs) 510-1 to 510-4 for the plurality of slices 410-1 to 410-4 based on a slope at which a spatial encoding gradient is applied. Here, the FOV may be determined by the spatial encoding gradient, which is an imaging region of the magnetic resonance imaging apparatus 100 for the object. The position information included in the magnetic resonance signals emitted from the object may correspond to a two-dimensional coordinate system (for example, the frequency direction (Gfrequency) and the phase direction (Gphase) excluding the slice direction (Gslice) of the position information) determined by the FOVs 510-1 to 510-4.

From a specific position of the plurality of slices 410-1 to 410-4, a magnetic resonance image signal 530 is received including the same or similar position information 530-1 to 530-4, as shown in FIG. 5B. As such, the magnetic resonance imaging apparatus 100 may receive the magnetic resonance signals of the respective slices 410-1 to 410-4 in a superposed state, including the same or similar position information.

Figure 5C:
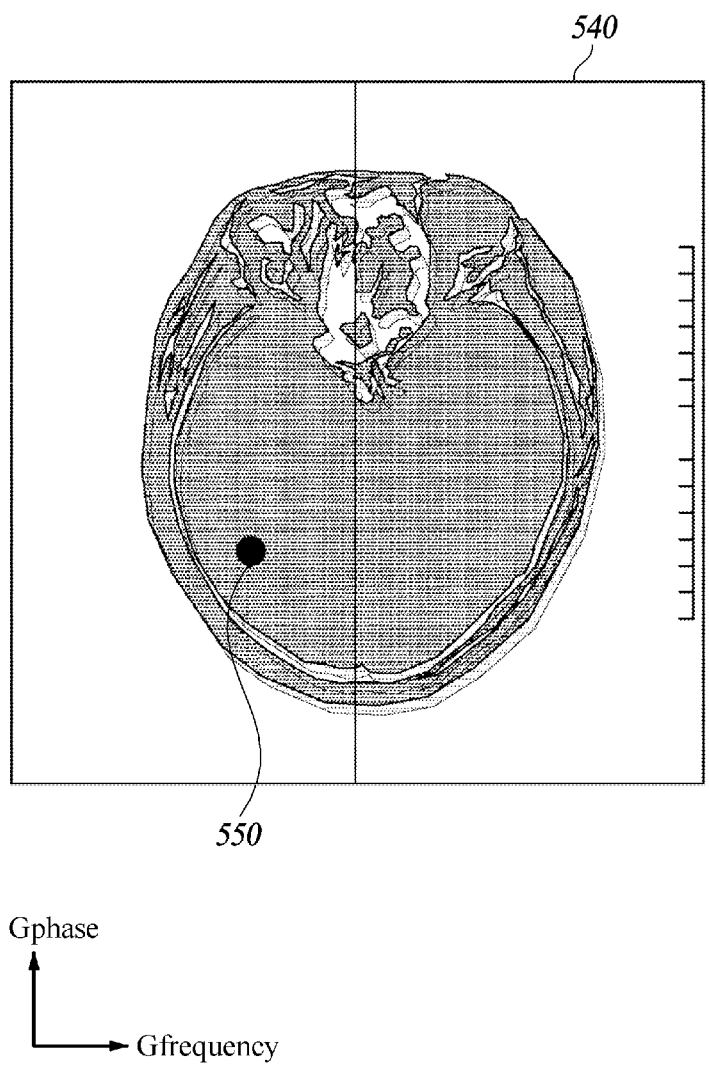
FIG. 5C is an exemplary diagram of the magnetic resonance signals imaged upon receipt from the plurality of slices 410-1 to 410-4, according to at least one embodiment.

FIG. 5C is an exemplary diagram of the magnetic resonance signals imaged upon receipt from the plurality of slices 410-1 to 410-4.

Referring to FIG. 5C, the magnetic resonance imaging apparatus 100 may generate a first MRI image 540 in which the MRI images of the respective slices 410-1 to 410-4 overlap each other. For example, the magnetic resonance signal 530 containing the same or similar position information may be imaged at the same or similar coordinates 550 in the first MRI image 540.

The magnetic resonance imaging apparatus 100 may acquire, for example, a difference in coil sensitivity information between slices. The magnetic resonance imaging apparatus 100 may separate the plurality of slices 410-1 to 410-4 by using the difference in coil sensitivity information between the plurality of slices 410-1 to 410-4, (410-1 to 410-4) corresponding to the respective coordinates in the first MRI image 540.

The magnetic resonance signals of the superposed slices 410-1 to 410-4 at the respective coordinates in the first MRI image 540 may be signals received from the same coil or neighboring coils. Therefore, the difference in coil sensitivity information between a plurality of slices corresponding to each coordinate in the first MRI image 540 may be insignificant. With the insignificant difference in coil sensitivity information between the slices, the MRI images separated by the respective slices may have a low signal to noise ratio (SNR).

Figure 6A:
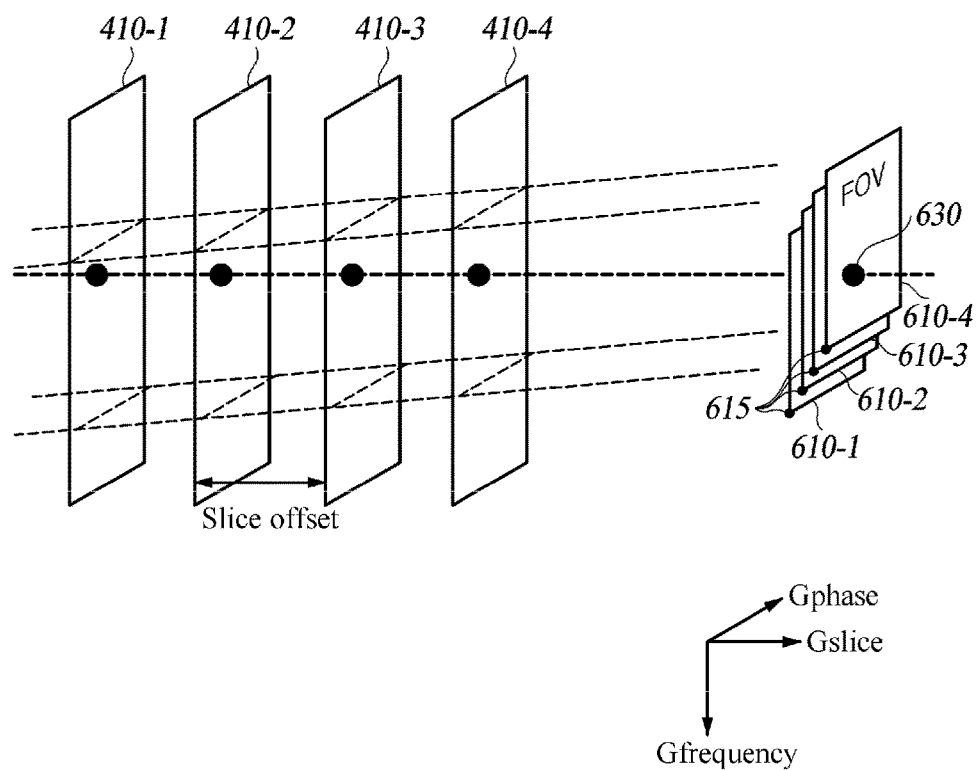
FIG. 6A is an exemplary diagram of magnetic resonance signals received from a plurality of slices 410-1 to 410-4 according to at least one embodiment.
Figure 6B:
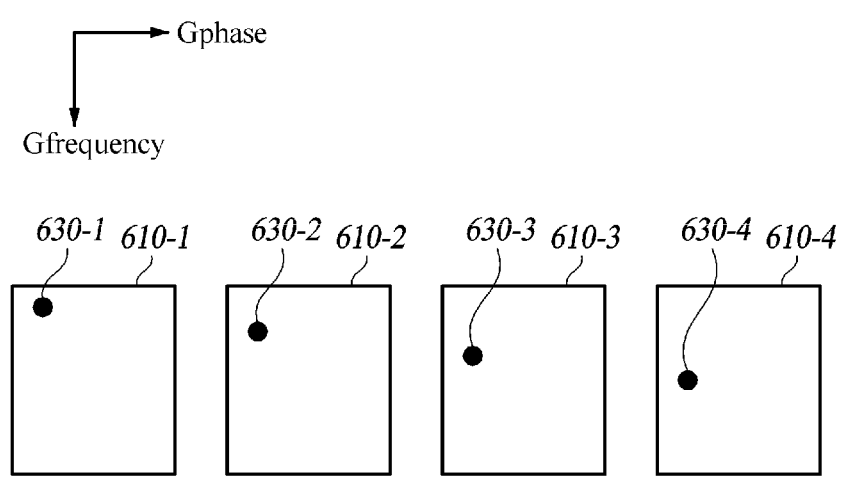
FIG. 6B is a diagram of magnetic resonance signals received from respective slices included in the plurality of slices 410-1 to 410-4.

FIG. 6A is an exemplary diagram of magnetic resonance signals received from a plurality of slices 410-1 to 410-4, and FIG. 6B is a diagram of magnetic resonance signals received from respective slices included in the plurality of slices 410-1 to 410-4.

Referring to FIG. 6A, a magnetic resonance imaging apparatus 100 may change FOVs 610-1 to 610-4 for the plurality of slices 410-1 to 410-4 determined by the spatial encoding gradient, by applying an additional gradient to the plurality of slices 410-1 to 410-4. Therefore, the magnetic resonance imaging apparatus 100 may shift reference points 615 of the two-dimensional coordinate system (e.g., the frequency direction (Gfrequency) and the phase direction (Gphase)) determined by the FOVs 610-1 to 610-4. The degree to which each reference point 615 is shifted may differ among the slices. Thus, the magnetic resonance signal of each slice may include position information shifted along the frequency axis (e.g., Gfrequency), based on the changed FOVs 610-1 to 610-4.

For example, as shown in FIG. 6B, the MRI image signal 630 received from a specific position in the plurality of slices 410-1 to 410-4 may include different position information 630-1 to 630-4.

Figure 6C:
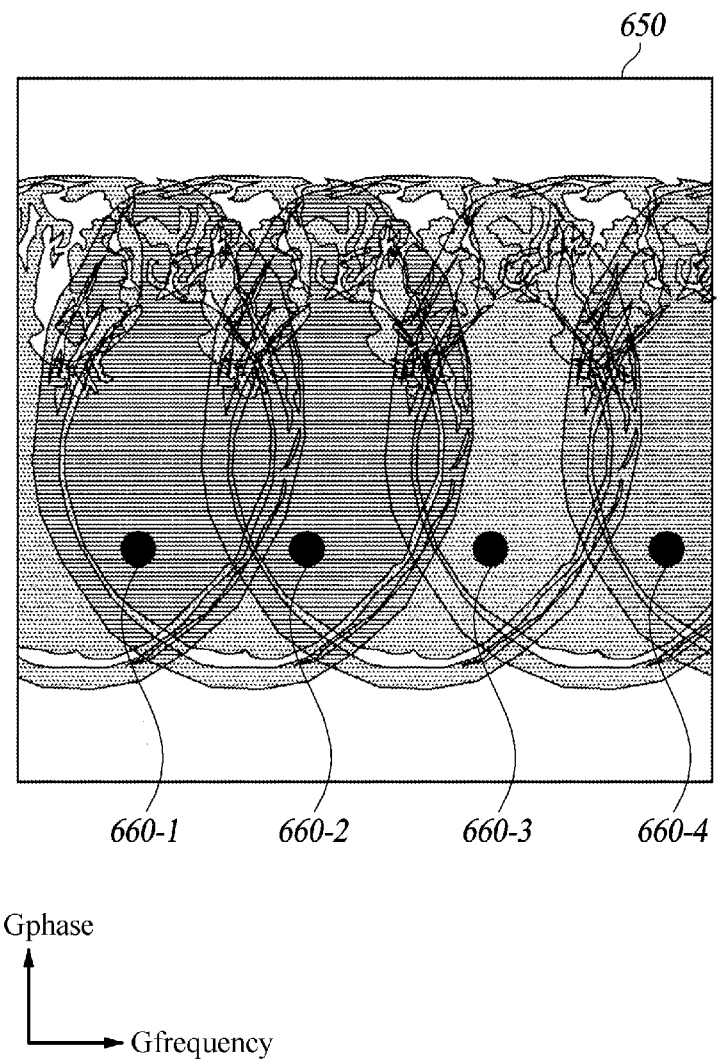
FIG. 6C is an exemplary diagram of magnetic resonance signals imaged upon receipt from the plurality of slices 410-1 to 410-4, according to at least one embodiment.

FIG. 6C is an exemplary diagram of magnetic resonance signals imaged upon reception from the plurality of slices 410-1 to 410-4.

Referring to FIG. 6C, the magnetic resonance imaging apparatus 100 may generate a second MRI image 650 in which the MRI images of each of the plurality of slices 410-1 to 410-4 respectively shifted along the frequency axis are superposed. For example, magnetic resonance signals including the different position information 630-1 to 630-4 may be imaged at different coordinates 660-1 to 660-4 in the second MRI image 650.

Therefore, the magnetic resonance signals of the respective slices 410-1 to 410-4 superposed at each coordinate of the second MRI image 650 may be signals received from different coils. Therefore, the coil sensitivity differences between the plurality of slices corresponding to respective coordinates in the second MRI image 650 may be different from each other.

Accordingly, the magnetic resonance imaging apparatus 100 according to some embodiments may generate an MRI image with respective slices having a high signal-to-noise ratio (SNR).

Figure 6D:
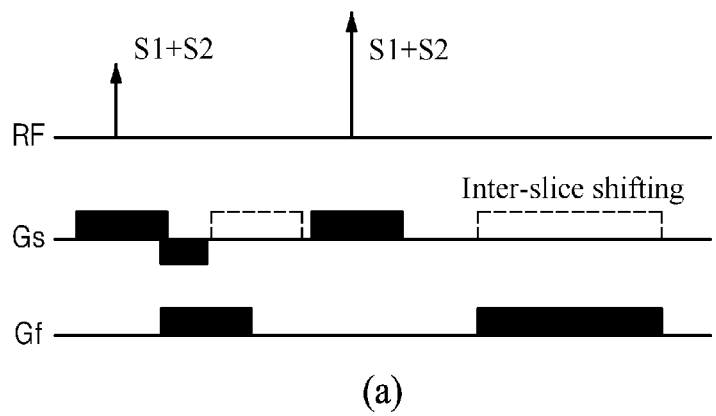
FIG. 6D is a diagram of a magnetic resonance signal received from each slice included in a plurality of slices, according to at least one embodiment.
Figure 6D:
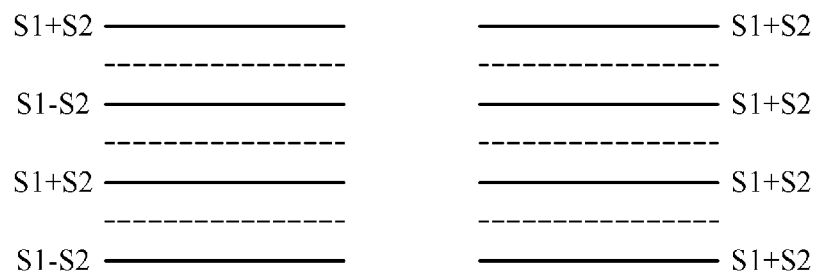
Figure 6D:
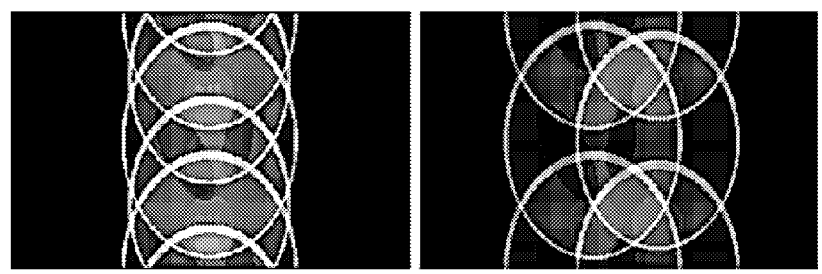

FIG. 6D is a diagram of a magnetic resonance signal received from each slice included in a plurality of slices, according to at least one embodiment.

The magnetic resonance imaging apparatus 100 generates an MRI image by using a technique for multi-sectional simultaneous image acquisition for more efficient utilization of various pieces of image information acquired from a plurality of coils.

In other words, the magnetic resonance imaging apparatus 100 according to some embodiments generates an MRI image using an MRI image acquisition technique, which utilizes read-out coil information by applying view angle tilting (VAT) which is a technique for correcting an error conventionally occurring in a fat tissue in an MRI image, and using an image reconstruction technique for restoring the MRI image.

As shown in FIGS. 6D at (b) and (c), the magnetic resonance imaging apparatus 100 may generate an MRI image by controlling the additional gradient such that images acquired at the same time are pushed in a read-out direction to overlap with each other. Here, the magnetic resonance imaging apparatus 100 may efficiently shorten the time to generate an MRI image with an orthogonal arrangement of the respective axes (two axes) along which the images are overlapped by the parallel imaging technique and the images are overlapped by the simultaneous multi-slice imaging technique.

Figure 7A:
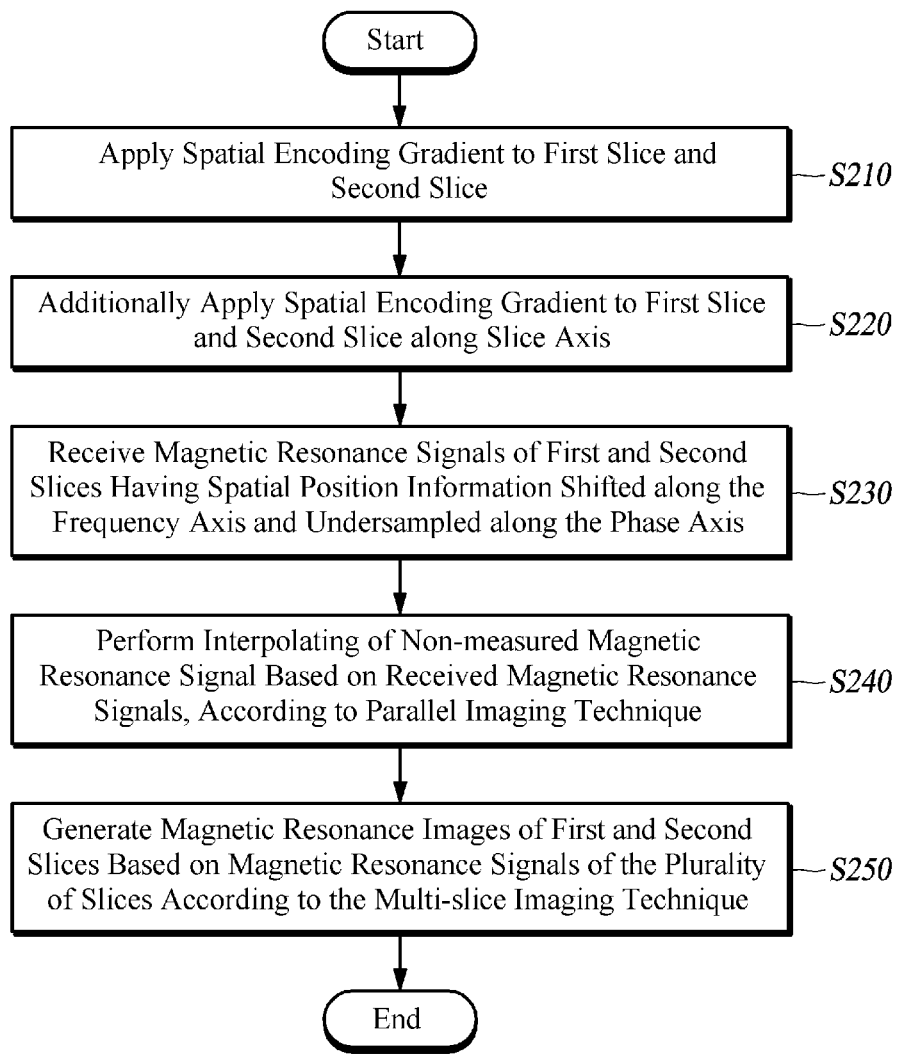
FIG. 7A is a flowchart of a magnetic resonance imaging method performed by a magnetic resonance imaging apparatus 100, according to at least one embodiment of the present disclosure.

FIG. 7A is a flowchart of a magnetic resonance imaging method performed by a magnetic resonance imaging apparatus 100, according to at least one embodiment of the present disclosure.

Referring to FIG. 7A, the magnetic resonance imaging apparatus 100 may apply a spatial encoding gradient to a first slice and a second slice (S210). The magnetic resonance imaging apparatus 100 may additionally apply a gradient in the slice direction (e.g., the Z axis) to the first slice and a second slice (S220). As the slice gradient is additionally applied, the position information of each slice may be shifted along the frequency axis.

The magnetic resonance imaging apparatus 100 may receive the magnetic resonance signals of the first and second slices that have position information shifted along the frequency axis and are undersampled along the phase axis (S230). As the FOV is shifted along the frequency axis, each slice may include position information shifted by a different amount along the frequency axis. Accordingly, the magnetic resonance imaging apparatus 100 may receive the magnetic resonance signals of the first and second slices in a superposed state at positions shifted along the frequency axis. For example, the magnetic resonance imaging apparatus 100 may simultaneously receive the magnetic resonance signals of the first and second slices in a superposed state in one TR period.

In addition, the magnetic resonance imaging apparatus 100 may receive magnetic resonance signals aliased along the phase axis by undersampling.

Additionally, the magnetic resonance imaging apparatus 100 may interpolate a non-measured magnetic resonance signal according to the parallel imaging technique based on the received magnetic resonance signals (S240). The magnetic resonance imaging apparatus 100 may calculate a spatial correlation coefficient which is a spatial interaction value between a calibration signal and a neighboring measured source signal, through, for example, self-calibration, and estimate the non-measured signal by using the calculated spatial correlation coefficient.

In addition, the magnetic resonance imaging apparatus 100 may generate an MRI image of each slice according to the multi-slice imaging technique based on the interpolated magnetic resonance signals (S250). The magnetic resonance imaging apparatus 100 may use a difference in coil sensitivity information between a plurality of slices to separate the magnetic resonance signal of each slice from the magnetic resonance signals of the plurality of slices received in a superposed state.

Further, the magnetic resonance imaging apparatus 100 may generate an MRI image of each slice based on the separated magnetic resonance signals.

Figure 7B:
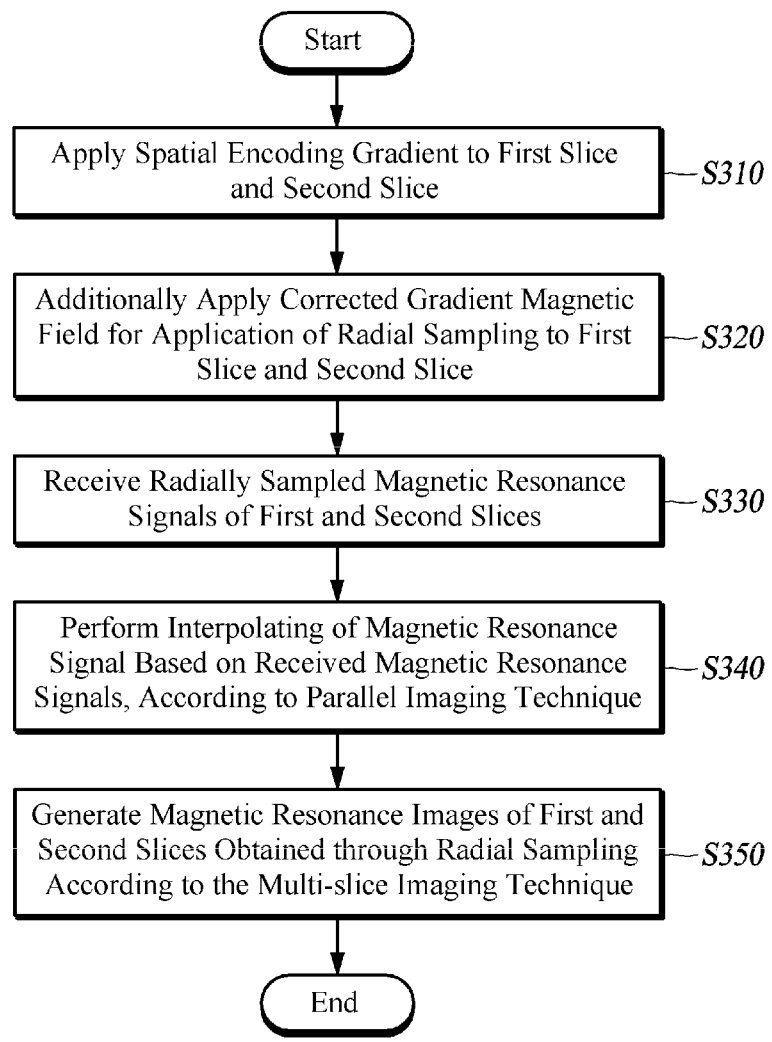
FIG. 7B is a flowchart of a magnetic resonance imaging method in which a magnetic resonance imaging apparatus 100 applies a radial sampling to generate MRI images.

FIG. 7B is a flowchart of a magnetic resonance imaging method in which a magnetic resonance imaging apparatus 100 applies a radial sampling to generate MRI images according to at least one embodiment.

Referring to FIG. 7B, the magnetic resonance imaging apparatus 100 may apply a spatial encoding gradient to the first slice and the second slice (S310).

The magnetic resonance imaging apparatus 100 may additionally apply, to the first slice and the second slice, a corrected gradient for applying radial sampling (S320).

Every TR, the magnetic resonance imaging apparatus 100 applies a corrected gradient, which is obtained by correcting the additional gradient on the basis of change in the magnitude of the gradient of the read-out section. Here, the magnetic resonance imaging apparatus 100 may correct the additional gradient by using a cosine function according to the angle of each slice in the radial sampling, or correct the additional gradient by adding an offset value of the radial sampling.

The magnetic resonance imaging apparatus 100 receives the magnetic resonance signals for the first and the second slice obtained through radial sampling (S330). The magnetic resonance imaging apparatus 100 receives the magnetic resonance signals for the first and second slices sampled using the radial coordinate system. Here, the magnetic resonance signals for the first and second slices may represent signals sampled every TR, and each slice may include position information shifted by a different amount along the frequency axis. Accordingly, the magnetic resonance imaging apparatus 100 may receive the magnetic resonance signals of the first and second slices in a superposed state at positions shifted along the frequency axis. For example, the magnetic resonance imaging apparatus 100 may receive magnetic resonance signals of the first and second slices in a superposed state simultaneously in one TR period.

The magnetic resonance imaging apparatus 100 interpolates a magnetic resonance signal according to the parallel imaging technique based on the received magnetic resonance signals (S340). The magnetic resonance imaging apparatus 100 may calculate a spatial correlation coefficient, which is a spatial interaction value between a calibration signal and a neighboring measured source signal, through, for example, self-calibration, and estimate the non-measured signal by using the calculated spatial correlation coefficient.

The magnetic resonance imaging apparatus 100 generates MRI images of the first and second slices to which radial sampling is applied according to the multi-slice imaging technique (S350). The magnetic resonance imaging apparatus 100 may use a difference in coil sensitivity information between a plurality of slices to separate the magnetic resonance signal of each slice from the magnetic resonance signals of the plurality of slices received in a superposed state. Further, the magnetic resonance imaging apparatus 100 may generate an MRI image of each slice based on the separated magnetic resonance signals.

While FIGS. 7A and 7B illustrate the operation of producing an MRI image using the first slice and the second slice which are two slices included in a plurality of slices, embodiments of the present disclosure are not limited thereto. The MRI image may be generated by using at least two slices among the plurality of slices.

Figure 8:
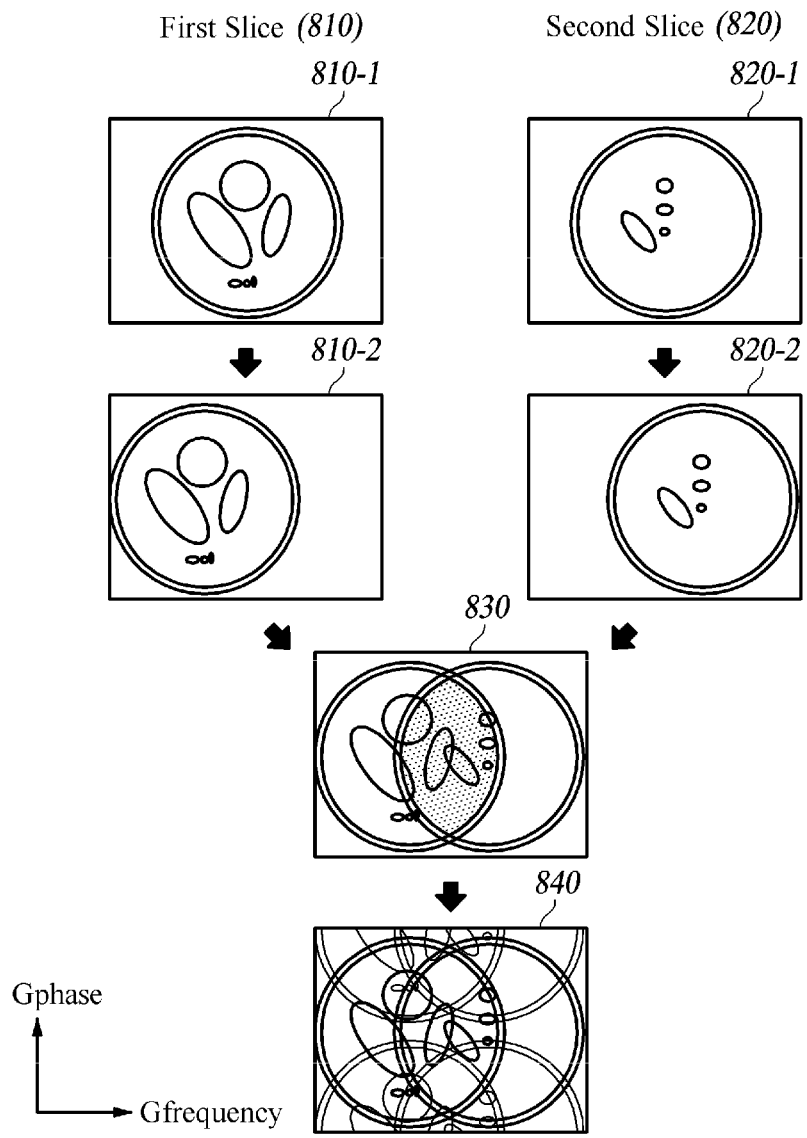
FIG. 8 is an exemplary diagram of magnetic resonance signals received by the magnetic resonance imaging apparatus 100, according to at least one embodiment.

FIG. 8 is an exemplary diagram of a magnetic resonance signal received by the magnetic resonance imaging apparatus 100.

Referring to FIG. 8, as a spatial encoding gradient is applied to a first slice 810 and a second slice 820, the magnetic resonance signals 810-1, 820-1 of the respective slices 810, 820 may include position information.

As a slice gradient is additionally applied to the respective slices 810, 820, the magnetic resonance signals 810-2, 820-2 of the respective slices 810, 820 may be received through shifted fields of view (FOVs). Therefore, the magnetic resonance signals 810-1 and 820-2 of the respective slices 810 and 820 may include position information shifted along the frequency axis.

The magnetic resonance imaging apparatus 100 may receive the magnetic resonance signals 810-2 and 820-2 of each slice including the position information shifted along the frequency axis in a superposed state 830.

The magnetic resonance imaging apparatus 100 may also receive a magnetic resonance signal 840 aliased along the phase axis as the signal is undersampled along the phase axis.

Since the magnetic resonance imaging apparatus 100 receives the magnetic resonance signals of the respective slices through different FOVs, there may be a difference in coil sensitivity information between the superposed slices. Accordingly, the magnetic resonance imaging apparatus 100 may generate an MRI image having a reduced signal-to-noise ratio (SNR) while shortening the scan time.

Figure 9:
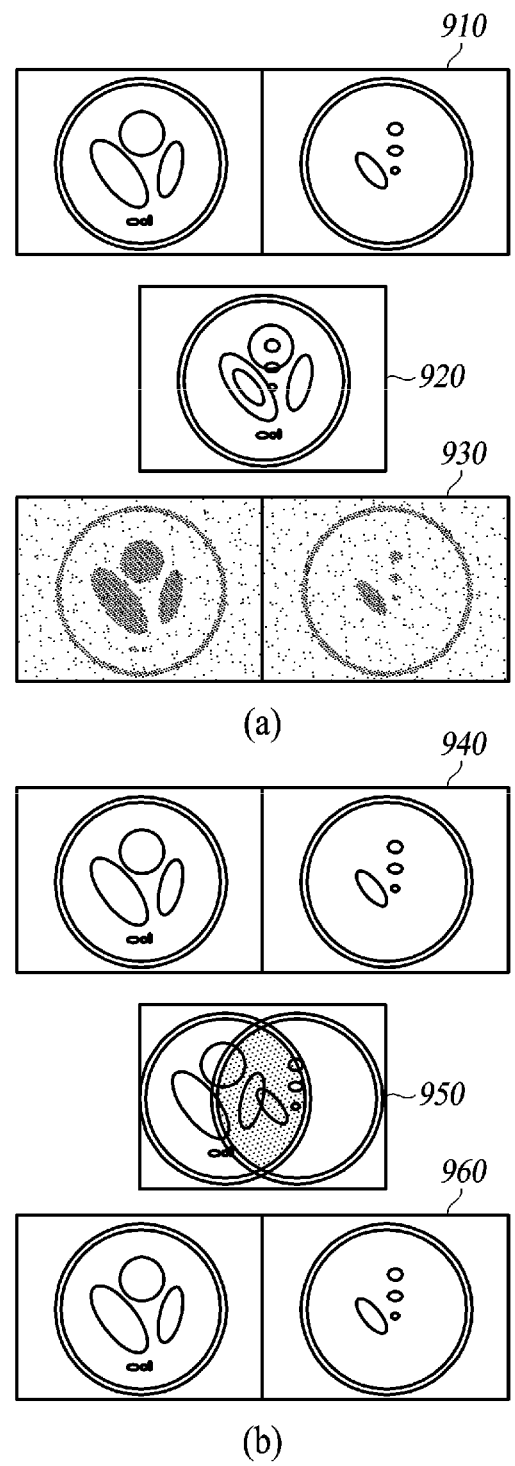
FIG. 9 is an exemplary diagram of the magnetic resonance imaging apparatus 100 producing a magnetic resonance image of each slice included in a plurality of slices, according to at least one embodiment

FIG. 9 is an exemplary diagram of the magnetic resonance imaging apparatus 100 producing a magnetic resonance image of each slice included in a plurality of slices.

Referring to FIG. 9 at (a), the magnetic resonance imaging apparatus 100 may generate an RF pulse having a plurality of frequencies and a pulse sequence having spatial encoding gradient pulses, thereby receiving magnetic resonance signals from a plurality of slices. The magnetic resonance imaging apparatus 100 may separate the magnetic resonance signals of the respective slices by using the difference in coil sensitivity information between the plurality of slices. If the plurality of slices is selected from the same tissue or similar tissues in the object in the object, the difference in coil sensitivity information between the plurality of slices may be insignificant.

Therefore, a generated MRI image of each slice may have defects and noise.

Referring to FIG. 9 at (b), the magnetic resonance imaging apparatus 100 according to some embodiments may generate an RF pulse having a plurality of frequencies and a pulse sequence having a slice pulse in addition to spatial encoding gradient pulses. In this case, the position information of each slice may be shifted along the frequency axis. Therefore, even if a plurality of slices is selected from the same tissue, the magnetic resonance imaging apparatus 100 may generate an MRI image having a high signal-to-noise ratio (SNR) by using the difference in coil sensitivity information between the plurality of slices.

Figure 10:
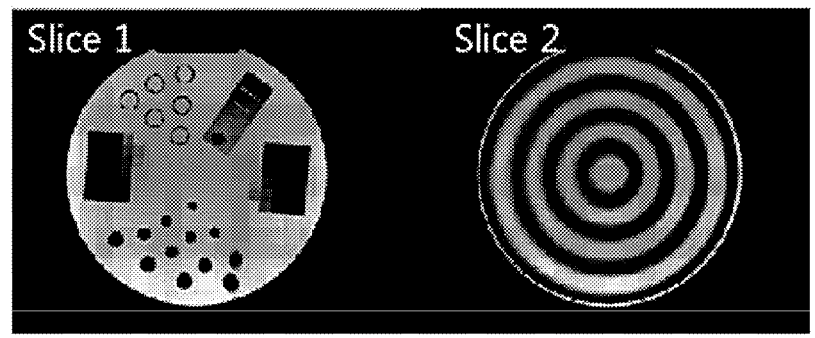
FIG. 10 is an exemplary diagram of a magnetic resonance imaging apparatus 100 processing magnetic resonance images using a resolution phantom, according to at least one embodiment.
Figure 10:
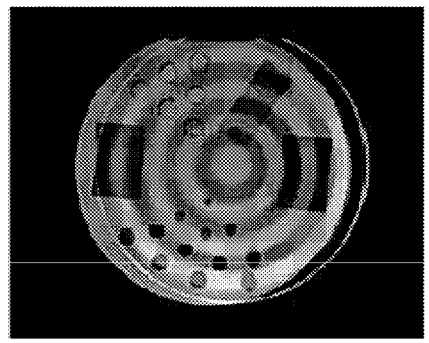
Figure 10:
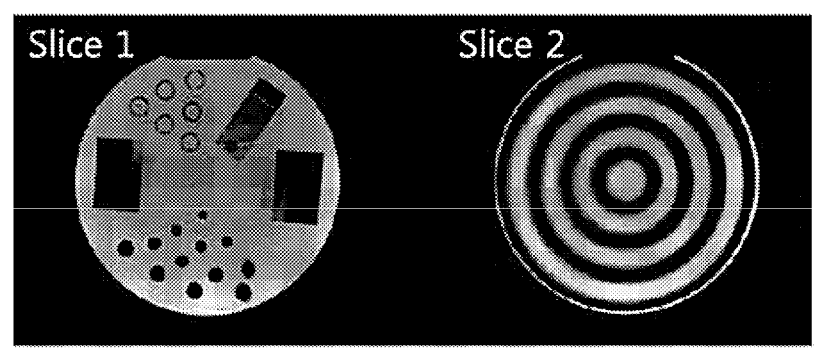

FIG. 10 is an exemplary diagram of a magnetic resonance imaging apparatus 100 processing magnetic resonance images by using a resolution phantom.

FIG. 10 at (a) shows the original images of the respective slices. The magnetic resonance imaging apparatus 100 may apply a spatial encoding gradient and a slice gradient to each slice and generate a magnetic resonance signal undersampled along the phase axis. FIG. 10 at (b) shows an image obtained after the magnetic resonance imaging apparatus 100 interpolated the magnetic resonance signal undersampled along the phase axis. As shown in FIG. 10 at (b), the images of the respective slices may be superposed while being shifted along the frequency axis. In addition, FIG. 10 at (c) shows a result of the magnetic resonance imaging apparatus 100 separating magnetic resonance signals of the respective slices from the MRI image of FIG. 10 at (b) by using the difference in coil sensitivity information.

As described above, the magnetic resonance imaging apparatus 100 according to some embodiments may generate an MRI image with an enhanced signal-to-noise ratio (SNR) while shortening the scan time.

FIG. 11 is an exemplary diagram of the magnetic resonance imaging apparatus 100 producing magnetic resonance images by applying a Cartesian sampling or radial sampling, according to at least one embodiment.

FIG. 11 at (a) shows a gradient with respect to a slice gradient serving as a reference in a Cartesian sampling, and FIG. 11 at (b) shows a gradient obtained by shifting a slice by additionally applying a gradient with a magnitude of 'A'. Here, the operations of FIGS. 11 at (a) and (b) are preferably the same as those described in FIGS. 6A to 6D.

FIG. 11 at (c) shows a gradient for a corrected gradient obtained by using a cosine function for application of radial sampling. FIG. 11 at (d) shows a gradient for a corrected gradient obtained by additionally correcting the offset value of radial sampling in applying the radial sampling.

Figure 12A:
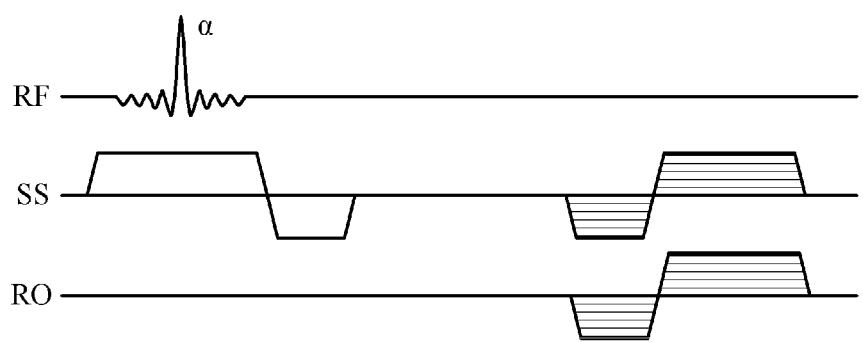
FIGS. 12A and 12B are exemplary diagrams of a sequence for processing magnetic resonance images by applying a radial sampling and changes in magnitude of a gradient due to an application of a corrected gradient, according to at least one embodiment.
Figure 12B:
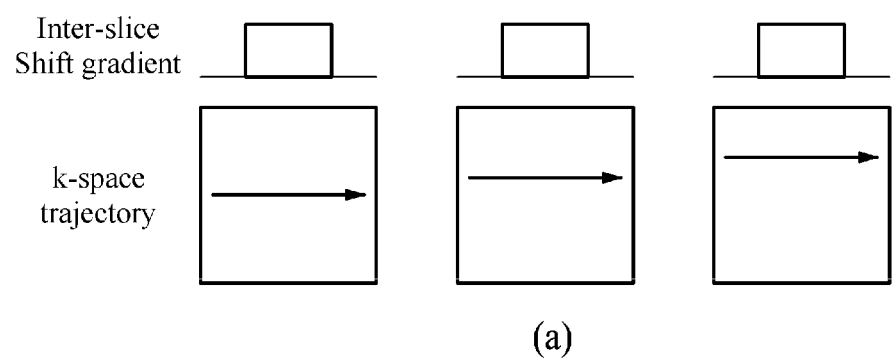
Figure 12B:
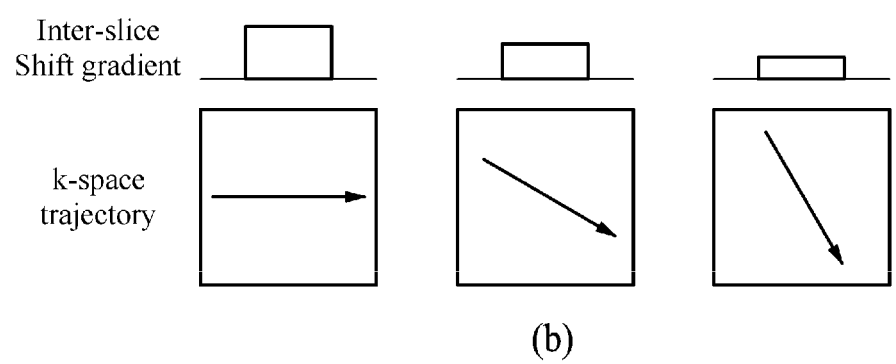

FIGS. 12A and 12B are exemplary diagrams of a sequence for processing magnetic resonance images by applying radial sampling and changes in magnitude of a gradient due to an application of a corrected gradient, according to at least one embodiment.

A sequence (MRI pulse sequence) for applying the radial sampling to the multi-slice imaging technique in the magnetic resonance imaging apparatus 100 is shown in FIG. 12A.

When the radial sampling is applied, different from typical Cartesian coordinate sampling, the magnitude of the read-out gradient changes every TR, and the magnetic resonance imaging apparatus 100 radially acquires data of the k-space through such change.

When the magnetic resonance imaging apparatus 100 applies an additional gradient, the slice is pushed in the read-out direction (FIG. 12B(a)). However, when radial sampling is applied, the magnitude of the gradient in the read-out direction changes in one image every TR, and the image is radially spread without being uniformly pushed in one direction.

Therefore, a corrected gradient needs to be applied by changing the magnitude of the additional gradient in accordance with changes in the magnitude of the gradient in the read-out direction. The magnitude of the corrected gradient is shown in FIG. 12B at (b). Here, the magnitude of the corrected gradient is calculated using Equation 1.

Figure 13:
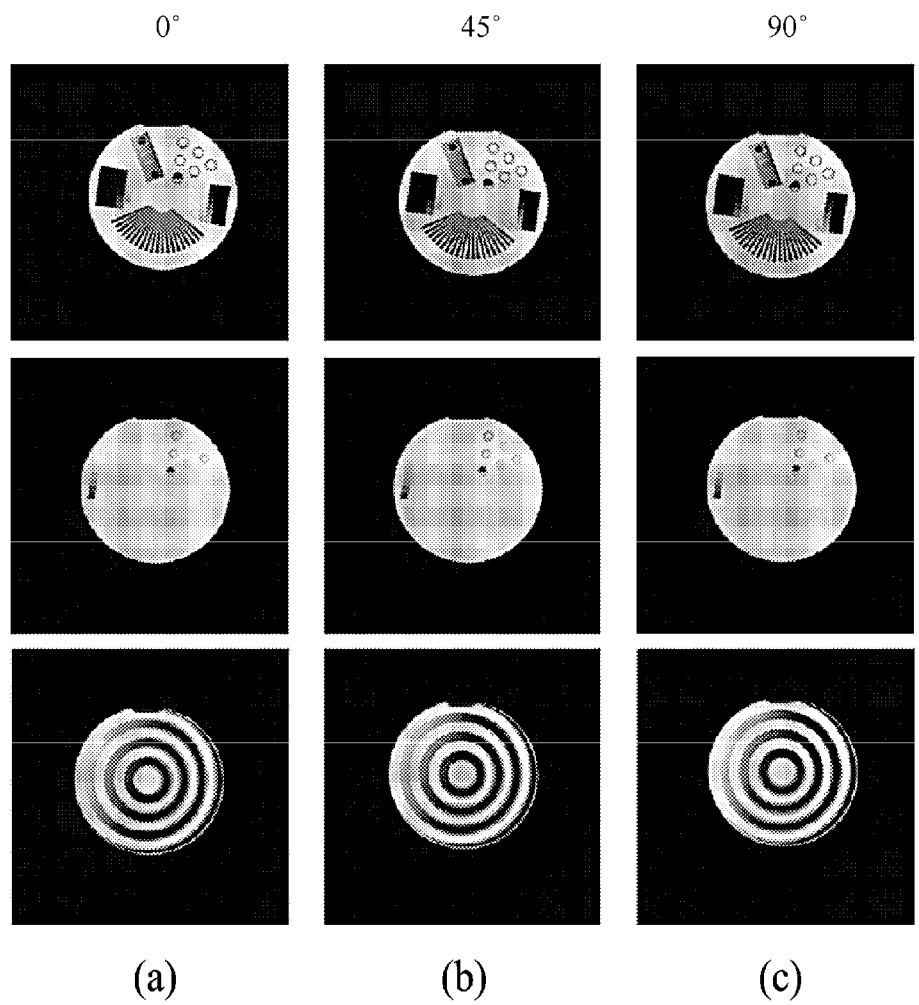
FIG. 13 is an exemplary diagram of a magnetic resonance image to which a radial sampling is applied in different magnitudes of a corrected gradient, according to at least one embodiment.

FIG. 13 is an exemplary diagram of a magnetic resonance image to which radial sampling is applied in different magnitudes of a corrected gradient, according to at least one embodiment.

FIG. 13 shows an experimental result (phantom result) obtained by implementing a magnetic resonance imaging method in which a magnetic resonance imaging apparatus actually applies a radial sampling. Here, it is confirmed that the direction in which each slice is pushed is changed when φ is adjusted to 0°, 45° and 90° based on Equation 1. The parameters used to acquire MRI images are as follows.

TR/TE=100 ms/15 ms
Flip angle=40 degrees
Slice thickness: 3 mm

As shown in FIG. 13, when radial sampling is actually applied in a magnetic resonance imaging apparatus, the slices are shifted in the multi-slice imaging technique, and thus the directions in which different slices are pushed may be adjusted. That is, as shown in FIG. 13, it may be confirmed that the slices are pushed in different directions when the value of $\phi$ is adjusted in Equation 1.

Figure 14:
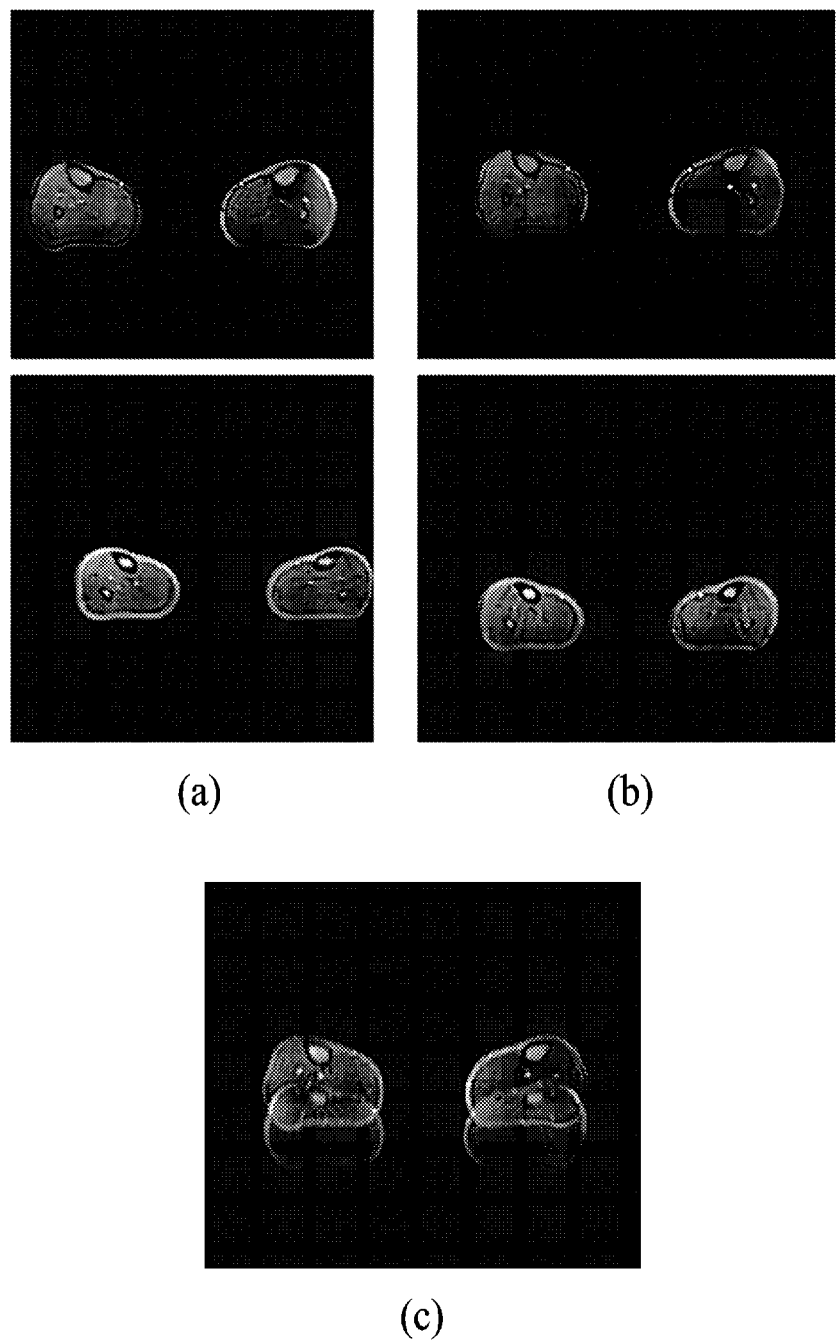
FIG. 14 is an exemplary diagram of a field of view (FOV) of an MRI image to which a radial sampling is applied, according to at least one embodiment.

FIG. 14 is an exemplary diagram of a field of view (FOV) of an MRI image to which radial sampling is applied, according to at least one embodiment.

FIG. 14 shows an experimental result (in-vivo result) obtained by implementing a magnetic resonance imaging method in which a radial sampling is actually applied in a magnetic resonance imaging apparatus.

While it is disclosed that an image of a leg region having a rectangular FOV is used to verify the magnetic resonance imaging method employing the radial sampling according to at least one embodiment, embodiments of the present disclosure are not limited thereto.

In the magnetic resonance imaging method employing radial sampling, which can minimize overlap between slices in the FOV when the multi-slice imaging technique is utilized, an image acquired when $\phi$ is 0° in Equation 1 is compared with an image acquired when $\phi$ is 90°, at which overlap between two slices is minimized. The parameters used to acquire the MRI image are the same as those in FIG. 13.

FIG. 14 at (a) shows a slice image when $\phi$ is 0°, and FIG. 14 at (b) shows a slice image when $\phi$ is 90°. As described above, in radial sampling, the FOV has a square shape, and accordingly it can be seen that the FOV above and below the slice image of the leg is wasted. Accordingly, as shown in FIG. 14 at (c), when the image is acquired using the multi-slice imaging technique by adjusting the value of $\phi$, the FOV area wasted in the radial sampling may be utilized.

Figure 15:
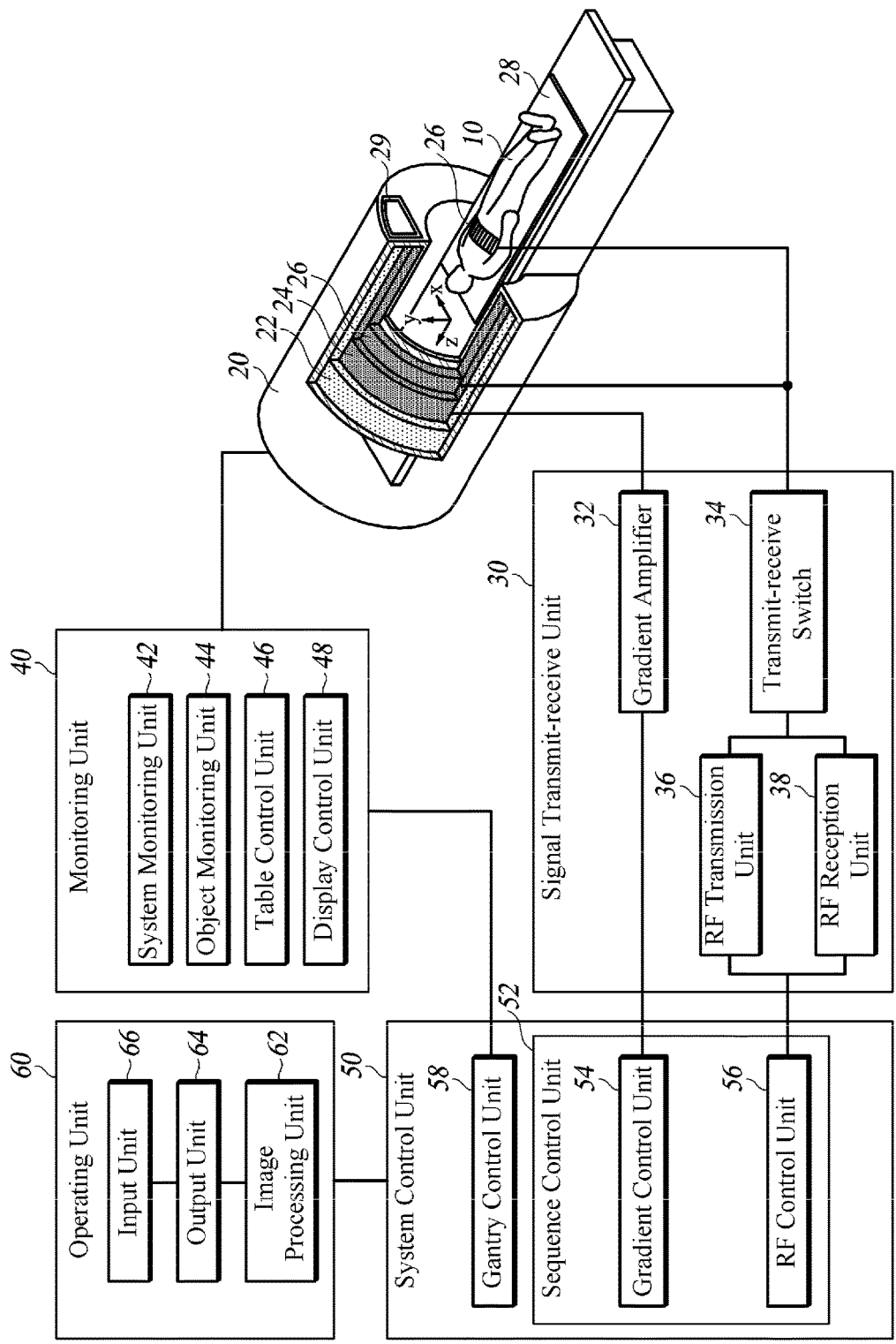
FIG. 15 is a diagram of a detailed configuration of a magnetic resonance imaging apparatus 100 according to at least one embodiment.

FIG. 15 is a diagram of a detailed configuration of a magnetic resonance imaging apparatus 100 according to at least one embodiment.

Referring to FIG. 15, the magnetic resonance imaging apparatus 100 includes a gantry 20, a signal transmit-receive unit 30, a monitoring unit 40, a system control unit 50 and an operating unit 60.

The gantry 20 blocks electromagnetic waves generated by a main magnet 22, a gradient coil 24, an RF coil 26 and the like from being radiated to the outside. A static magnetic field and a gradient are formed in a bore in the gantry 20, and an RF signal is radiated toward an object 10.

The main magnet 22, the gradient coil 24, and the RF coil 26 may be disposed in a predetermined direction of the gantry 20. The predetermined direction may include a coaxial cylindrical direction. The object 10 may be placed on a table 28 that can be inserted into a cylinder along the horizontal axis of the cylinder.

The main magnet 22 generates a static magnetic field to align the magnetic dipole moments of the atomic nuclei included in the object 10 in a certain direction. As the magnetic field generated by the main magnet 22 becomes stronger and more uniform, a more precise and accurate MRI image of the object 10 may be obtained.

The gradient coils 24 includes X, Y and Z coils that generate gradients along the X-axis, Y-axis and Z-axis. The gradient coil 24 may provide position information of each part of the object 10 by inducing different resonance frequencies for the respective parts of the object 10.

The RF coil 26 may radiate an RF signal to a patient and receive an MR signal emitted from the patient. Specifically, the RF coil 26 may transmit an RF signal having the same frequency as the frequency of precession of atomic nuclei present in a patient, then stop transmitting the RF signal and receive MR signals emitted from the atomic nuclei present in the patient.

For example, the RF coil 26 may generate an electromagnetic wave signal having a radio frequency corresponding to the kind of an atomic nucleus, for example, an RF signal, in order to transition the atomic nucleus from a low energy state to a high energy state, and apply the generated signal to the object 10. When the electromagnetic wave signal generated by the RF coil 26 is applied to an atomic nucleus, the atomic nucleus may transition from a low energy state to a high energy state. Thereafter, when the electromagnetic wave generated by the RF coil 26 disappears, the atomic nucleus to which the electromagnetic wave has been applied may emit an electromagnetic wave having the Larmor frequency while transitioning from a high energy state to a low energy state. In other words, when the application of the electromagnetic wave signal to the atomic nucleus is interrupted, an electromagnetic wave having the Larmor frequency may be emitted from the atomic nucleus to which the electromagnetic wave has been applied as change in energy level from a high energy to a low energy occurs in the atomic nucleus. The RF coil 26 may receive electromagnetic wave signals radiated from the atomic nuclei inside the object 10.

The RF coil 26 may be implemented by one RF transmission/reception coil having both a function of generating an electromagnetic wave having a radio frequency corresponding to the kind of an atomic nucleus and a function of receiving electromagnetic waves radiated from the atomic nucleus. The RF coil 26 may also be implemented as an RF transmission coil having a function of generating an electromagnetic wave having a radio frequency corresponding to the kind of an atomic nucleus and as an RF reception coil having a function of receiving an electromagnetic wave radiated from the atomic nucleus.

Further, the RF coil 26 may be fixed to the gantry 20 and may be detachable. The detachable RF coil 26 may include RF coils for a portion of the object including a head RF coil, a thorax RF coil, a leg RF coil, a neck RF coil, a shoulder RF coil, a wrist RF coil, and an ankle RF coil.

The RF coil 26 may communicate with an external device in a wired and/or wireless manner, and may also perform dual tune communications according to a communication frequency band.

The RF coil 26 may include a birdcage coil, a surface coil, and a transverse electromagnetic coil (TEM coil) according to the structure of the coils.

The RF coil 26 may also include a transmission-only coil, a reception-only coil, and a transmission/reception coil according to RF signal transmission/reception methods.

The RF coil 26 may also include RF coils of various channels such as 16 channels, 32 channels, 72 channels, and 144 channels.

The gantry 20 may further include a display 29 positioned outside the gantry 20 and a display (not shown) positioned inside the gantry 20. Thereby, predetermined information may be provided to a user or an object through the displays positioned inside and outside the gantry 20.

The signal transmit-receive unit 30 may control a gradient formed in the gantry 20, that is, the bore, according to a predetermined MR sequence, and control transmission and reception of an RF signal and an MR signal.

The signal transmit-receive unit 30 may include a gradient amplifier 32, a transmit-receive switch 34, an RF transmission unit 36, and an RF reception unit 38.

The gradient amplifier 32 may drive the gradient coil 24 included in the gantry 20 and apply a pulse signal for the generation of a gradient to the gradient coil 32 under control of the gradient control unit 54. By controlling the pulse signal supplied from the gradient amplifier 32 to the gradient coil 24, gradients along the X-axis, Y-axis, and Z-axis may be synthesized.

According to some embodiments, the gradient control unit 54 may supply the gradient coil 24 with a pulse signal for generating a spatial encoding gradient including gradients along the X-axis, Y-axis, and Z-axis and a gradient along the Z-axis through the gradient amplifier 32.

The RF transmission unit 36 and the RF reception unit 38 may drive the RF coil 26. The RF transmission unit 36 may supply an RF pulse of the Larmor frequency to the RF coil 26, and the RF reception unit 38 may receive the MR signal received by the RF coil 26.

The RF reception unit 38 according to some embodiments may receive an MR signal including position information according to a spatial encoding gradient. The RF reception unit 38 may also receive an MR signal including the position information shifted along the X-axis as the gradient along the Z-axis is further applied to the object.

Further, the RF reception unit 38 may receive an MR signal undersampled along the Y-axis. Alternatively, the RF reception unit 38 may receive an MR signal undersampled in a spiral direction.

The transmit-receive switch 34 may adjust the transmission and reception directions of the RF signal and the MR signal. For example, an RF signal may be radiated to the object 10 via the RF coil 26 in the transmission mode, and an MR signal from the object 10 may be received via the RF coil 26 in the reception mode. The transmit-receive switch 34 may be controlled by a control signal from the RF control unit 56.

The monitoring unit 40 may monitor or control the gantry 20 or devices mounted on the gantry 20. The monitoring unit 40 may include a system monitoring unit 42, an object monitoring unit 44, a table control unit 46 and a display control unit 48.

The system monitoring unit 42 may monitor and control the state of the static magnetic field, the state of the gradient, the state of the RF signal, the state of the RF coil, the state of the table, the state of a device for measuring the body information about the object, the power supply state, the state of a heat exchanger, the state of a compressor, and the like.

The object monitoring unit 44 monitors the state of the object 10. Specifically, the object monitoring unit 44 may include a camera for observing the movement or position of the object 10, a respiration measurement device for measuring respiration of the object 10, an ECG (electrocardiogram) measurement device for measuring the electrocardiogram of the object 10, or a body temperature measurement device for measuring the body temperature of the object 10.

The table control unit 46 controls movement of the table 28 on which the object 10 is positioned. The table control unit 46 may control movement of the table 28 in accordance with sequence control of the sequence control unit 50. For example, in moving imaging of the object, the table control unit 46 may move the table 28 continuously or intermittently according to sequence control by the sequence control unit 50. Thereby, imaging of the object may be performed with a wider field of view (FOV) than the FOV of the gantry.

The display control unit 48 controls the displays positioned outside and inside the gantry 20. Specifically, the display control unit 48 may control on/off of the displays positioned outside and inside the gantry 20, a screen image to be output to the displays, or the like. Further, when a speaker is positioned inside or outside the gantry 20, the display control unit 48 may control on/off of the speaker, the sound to be output through the speaker, or the like.

The system control unit 50 may include a sequence control unit 52 for controlling a sequence of signals formed in the gantry 20 and a gantry control unit 58 for controlling the gantry 20 and the devices mounted on the gantry 20.

The sequence control unit 52 may include a gradient control unit 54 for controlling the gradient amplifier 32 and an RF control unit 56 for controlling the RF transmission unit 36, the RF reception unit 38 and the transmit-receive switch 34. The sequence control unit 52 may control the gradient amplifier 32, the RF transmission unit 36, the RF reception unit 38 and the transmit-receive switch 34 in accordance with a pulse sequence received from the operating unit 60. Here, the pulse sequence includes all information necessary to control the gradient amplifier 32, the RF transmission unit 36, the RF reception unit 38, and the transmit-receive switch 34. For example, the pulse sequence may include information on the intensity of the pulse signal applied to the gradient coil 24, the application time, the application timing, and the like.

According to some embodiments, the sequence controller 52 may receive, from the operating unit 60, a spin echo pulse sequence including an RF pulse including a plurality of frequency components, a spatial encoding gradient pulse, and a gradient pulse along the Z-axis.

The sequence control section 52 may also receive, from the operating unit 60, at least one spiral RF pulse sequence having a spiral trajectory in k-space.

The operating unit 60 may deliver pulse sequence information to the system control unit 50 and control the operation of the entire MRI system.

The operating unit 60 may include an image processing unit 62, an output unit 64 and an input unit 66 for receiving and processing the MR signal received by the RF reception unit 38.

The image processing unit 62 may process an MR signal received from the RF reception unit 38 to generate MR image data (i.e., MRI images) of the object 10.

The image processing unit 62 receives the MR signal received by the RF reception unit 38 and performs various kinds of signal processing such as amplification, frequency conversion, phase detection, low frequency amplification, filtering, and the like on the received MR signal.

The image processing unit 62 may arrange digital data in k-space (also referred to as, for example, Fourier space or frequency space) of a memory, and reconstruct image data by performing a two-dimensional or three-dimensional Fourier transform on the digital data.

Further, the image processing unit 62 may perform synthesis or differential operation on the reconstructed image data as necessary. The synthesis processing may include addition of pixels and maximum intensity projection (MIP). In addition, the image processing unit 62 may store not only the reconstructed image data but also the image data subjected to synthesis or differential operation in a memory (not shown) or an external server.

In addition, various signal processing operations applied to the MR signal by the image processing unit 62 may be performed in parallel. For example, signal processing operations may be applied to a plurality of MR signals received by a multichannel RF coil in parallel to reconstruct the MR signals as image data.

According to some embodiments, the image processing unit 62 may receive an undersampled MR signal and interpolate the non-measured data in k-space. For example, the image processing unit 62 may estimate the non-measured data based on a parallel image processing technique such as GRAPPA and SENSE.

Further, the image processing unit 62 may separate the magnetic resonance signal of a plurality of slices into magnetic resonance signals of the respective slices. For example, the image processing unit 62 may separate the magnetic resonance signal of a plurality of slices into magnetic resonance signals of the respective slices based on multi-slice imaging such as slice-GRAPPA or multi-slice CAIPIRINHA (ms-CAIPIRINHA). The image processing unit 62 may separate the magnetic resonance signals of the respective slices based on the difference in coil sensitivity information between the plurality of slices.

Further, the image processing unit 62 may generate image data of each slice based on the separated magnetic resonance signals.

The output unit 64 may output the image data generated or reconstructed by the image processing unit 62 to the user. The output unit 64 may output information necessary for a user to operate the MRI system, such as a user interface (UI), user information, or object information. The output unit 64 may be a speaker, a printer, a CRT display, an LCD display, a PDP display, an OLED display, an FED display, an LED display, a VFD display, a Digital Light Processing (DLP) display, a Flat Panel Display (FPD), a 3D display, a transparent display, or the like, and may include various output devices within a range apparent to those skilled in the art.

The user may input object information, parameter information, and information about a scan condition, a pulse sequence, image synthesis or a differential operation, using the input unit 66. Examples of the input unit 66 may include a keyboard, a mouse, a trackball, a voice recognition unit, a gesture recognition unit, and a touchscreen, and may include various input devices within a range apparent to those skilled in the art.

Although the signal transmit-receive unit 30, the monitoring unit 40, the system control unit 50, and the operating unit 60 are illustrated as separate objects in FIG. 15, the functions performed by the signal transmit-receive unit 30, the monitoring unit 40, the system control unit 50, and the operating unit 60 may be performed by other objects, as will be understood by those skilled in the art. For example, while the image processing unit 62 has been described as converting an MR signal received by the RF reception unit 38 into a digital signal, the RF reception unit 38 or RF coil 26 may directly perform conversion into a digital signal.

The gantry 20, the RF coil 26, the signal transmit-receive unit 30, the monitoring unit 40, the system control unit 50 and the operating unit 60 may be connected to each other wirelessly or by wire, and, when wirelessly connected, a device (not shown) for synchronizing clocks of the gantry 20, the RF coil 26, the signal transmit-receive unit 30, the monitoring unit 40, the system control unit 50 and the operating unit 60 with each other may be further provided.

Communications between the gantry 20, the RF coil 26, the signal transmit-receive unit 30, the monitoring unit 40, the system control unit 50, and the operating unit 60 may be performed through a high speed digital interface such as Low Voltage Differential Signaling (LVDS), asynchronous serial communication such as universal asynchronous receiver transmitter (UART), synchronous serial communication, or a low delay network protocol such as Controller Area Network (CAN), optical communication and the like. Various communication methods may be used within a range apparent to those skilled in the art.

Figure 16:
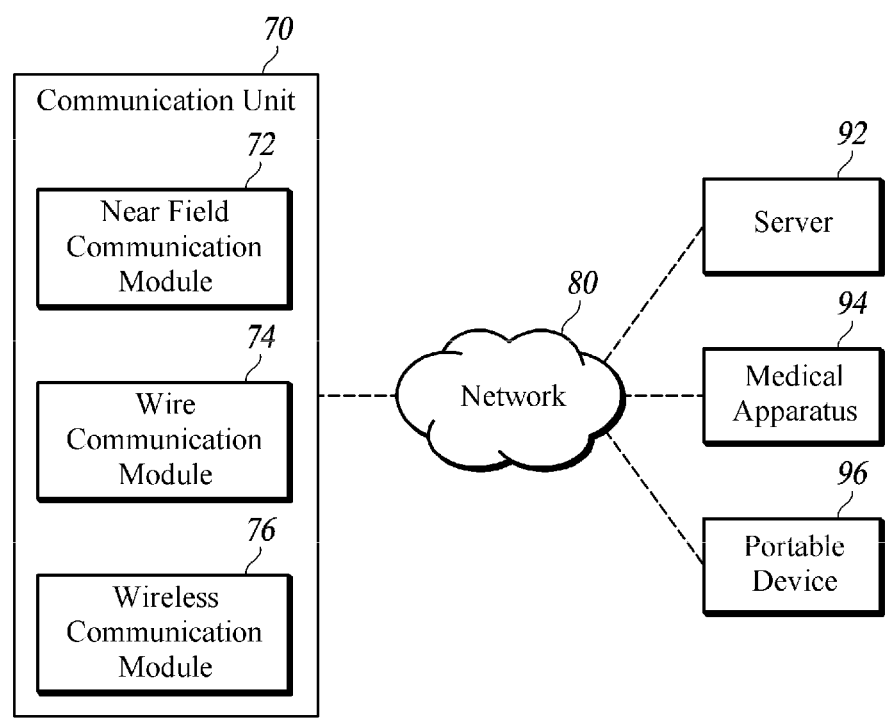
FIG. 16 is a diagram of a communication unit (70) according to at least one embodiment.

FIG. 16 is a diagram of a communication unit 70 according to at least one embodiment. The communication unit 70 may be connected to at least one of the gantry 20, the signal transmit-receive unit 30, the monitoring unit 40, the system control unit 50, and the operating unit 60 shown in FIG. 15.

The communication unit 70 may exchange data with a hospital server or other medical devices in a hospital, which are connected thereto through a Picture Archiving and Communication System (PACS), and may perform data communication according to the Digital Imaging and Communications in Medicine (DICOM) standard.

As shown in FIG. 16, the communication unit 70 may be connected to the network 80 by wire or wirelessly, and may communicate with a server 92, a medical device 94 or a portable device 96.

Specifically, the communication unit 70 may transmit and receive data related to the diagnosis of an object over the network 80, and may transmit and receive medical images captured by the medical apparatuses 94 such as CT, MRI, and X-ray. Further, the communication unit 70 may receive the diagnosis history or the treatment schedule of a patient from the server 92 and utilize the same for diagnosis of the patient. The communication unit 70 may perform data communications with not only the server 92 or the medical apparatuses 94 in the hospital but also the portable device 96 such as a mobile phone, a PDA, or a notebook computer of a doctor or the patient.

Additionally, the communication unit 70 may transmit abnormality of the MRI system or medical image quality information to the user over the network 80, and may receive corresponding feedback from the user.

The communication unit 70 may include one or more components that enable communication with an external device, and may include, for example, a near field communication module 72, a wired communication module 74 and a wireless communication module 76.

The near field communication module 72 refers to a module for near field communication with a device located within a predetermined distance. The local area communication technology according to at least one embodiment of the present disclosure includes wireless LAN, Wi-Fi, Bluetooth, ZigBee, Wi-Fi Direct (WFD), ultra wideband (UWB), Infrared Data Association (IrDA), Bluetooth Low Energy (BLE), and Near Field Communication (NFC). However, embodiments of the present disclosure are not limited thereto.

The wired communication module 74 refers to a module for performing communications using an electrical signal or an optical signal. The wired communication technology according to at least one embodiment of the present disclosure may include wired communication technologies using a pair cable, a coaxial cable, an optical fiber cable and the like, and other wired communication technologies apparent to those skilled in the art.

The wireless communication module 76 transmits and receives a radio signal to and from at least one of a base station, an external device, and a server over a mobile communication network. Here, the radio signal may include a voice call signal, a video call signal, or various types of data according to transmission/reception of a text message/multimedia message.

The above-described embodiments may be implemented as a program executable in a computer, and may be implemented in a general-purpose digital computer that runs the program using a non-transitory computer-readable recording medium.

Examples of the computer-readable recording medium include magnetic storage medium, e.g., a ROM, a floppy disk and a hard disk, optical data storage medium, e.g., a CD-ROM and a DVD, and a carrier wave, e.g., transmission through the Internet.

As described above, according to some embodiments of the present disclosure, an MRI apparatus provides a user with an MRI image having an enhanced signal-to-noise ratio (SNR) while shortening a scan time.

In addition, the MRI apparatus applies a radial sampling in a multi-slice image reconstruction technique as a corrected gradient for radial sampling is applied in every TR.

Further, as the MRI apparatus applies a radial sampling by applying a corrected gradient, the MRI apparatus provides an MRI image having a wider field of view (FOV) area (for example, rectangular area) than in the typical radial sampling.

Although exemplary embodiments of the present disclosure have been described for illustrative purposes, those skilled in the art will appreciate that various modifications, additions and substitutions are possible, without departing from the various characteristics of the disclosure. Therefore, exemplary embodiments of the present disclosure have been described for the sake of brevity and clarity. Accordingly, one of ordinary skill would understand the scope of the disclosure is not limited by the explicitly described above embodiments but by the claims and equivalents thereof.

What is claimed is:

1. A magnetic resonance imaging apparatus, comprising:
   a gradient control unit configured to apply a spatial encoding gradient to at least two slices of a plurality of slices and to apply a corrected gradient for an application of a radial sampling to the at least two slices, which is based on a change in magnitude of a read-out gradient;
   an RF (radio frequency) reception unit configured to receive a magnetic resonance signal of each of the at least two slices radially sampled by applying the corrected gradient; and
   an image processing unit configured to generate an MRI (magnetic resonance imaging) image of each of the at least two slices based on received magnetic resonance signals,
   wherein the image processing unit is configured to interpolate a non-measured magnetic resonance signal in a parallel imaging, and to generate the MRI image of each of the at least two slices by using a simultaneous multi-slice imaging technique.

2. The magnetic resonance imaging apparatus of claim 1, wherein the
   gradient control unit applies the corrected gradient in every TR (repetition time) period, and the RF reception unit receives magnetic resonance signals of the at least two slices in a superposed state in each TR period.

3. The magnetic resonance imaging apparatus of claim 2, wherein the magnetic resonance signal of each of the at least two slices contains a position information shifted in a radial direction as the corrected gradient is applied.

4. The magnetic resonance imaging apparatus of claim 2, wherein the
   corrected gradient is obtained by correcting an additional gradient for shifting the magnetic resonance signal of each of the at least two slices along a frequency axis in a Cartesian coordinate sampling, by using a cosine or sine function.

5. The magnetic resonance imaging apparatus of claim 4, wherein the
   corrected gradient is a gradient obtained by adding an offset value of the radial sampling to the cosine or sine function.

6. The magnetic resonance imaging apparatus of claim 1, wherein the
   spatial encoding gradient comprises:
   a slice gradient related to a gradient in a slice direction, a frequency gradient related to a gradient in a frequency direction, and a phase gradient related to a gradient in a phase direction.

7. A magnetic resonance imaging method, comprising:
   performing a gradient control comprising:
      applying a spatial encoding gradient to at least two slices of a plurality of slices, and
      applying a corrected gradient for an application of a radial sampling to the at least two slices, which is based on a change in magnitude of a read-out gradient;
   performing an RF (radio frequency) reception comprising:
      receiving a magnetic resonance signal of each of the at least two slices radially sampled by applying the corrected gradient; and
   performing an image processing comprising:
      generating an MRI (magnetic resonance imaging) image of each of the at least two slices based on received magnetic resonance signals,
      wherein the generating the MRI image comprises interpolating a non-measured magnetic resonance signal in a parallel imaging, and generating the MRI image of each of the at least two slices by using a simultaneous multi-slice imaging technique.

8. The magnetic resonance imaging method of claim 7, wherein the
   performing of the gradient control comprises:
      applying the corrected gradient in every TR (repetition time) period, and
   wherein the performing of the RF reception comprises:
      receiving magnetic resonance signals of the at least two slices in a superposed state in each TR period.

9. The magnetic resonance imaging method of claim 8, wherein the magnetic resonance signal of each of the at least two slices contains a position information shifted in a radial direction as the corrected gradient is applied.

10. The magnetic resonance imaging method of claim 7, wherein the
    corrected gradient is obtained by correcting an additional gradient for shifting the magnetic resonance signal of each of the at least two slices along a frequency axis in a Cartesian coordinate sampling, by using a cosine or sine function.

11. The magnetic resonance imaging method of claim 10, wherein the corrected gradient is a gradient obtained by adding an offset value of the radial sampling to the cosine or sine function.

* * * * *